United States Patent [19]

Ohyu et al.

[11] Patent Number: 5,426,326
[45] Date of Patent: Jun. 20, 1995

[54] SEMICONDUCTOR DEVICE INCLUDING ARRANGEMENT FOR REDUCING JUNCTION DEGRADATION

[75] Inventors: Kiyonori Ohyu, Hachioji; Kozo Watanabe, Kodaira; Osamu Tsuchiya, Hamura; Kazuyoshi Oshima, Ome; Yoshifumi Kawamoto, Tsukui; Atsushi Hiraiwa, Higashi; Takashi Nishida, Tokyo, all of Japan

[73] Assignee: Hitachi, Ltd., Tokyo, Japan

[21] Appl. No.: 103,206

[22] Filed: Aug. 9, 1993

[30] Foreign Application Priority Data

Aug. 7, 1992 [JP] Japan .................. 4-211212

[51] Int. Cl.⁶ .......................... H01L 29/165
[52] U.S. Cl. .................. 257/408; 257/327; 257/655
[58] Field of Search ........... 257/306, 378, 282–287, 257/403, 404, 408, 346, 327, 336, 344, 343, 655

[56] References Cited

U.S. PATENT DOCUMENTS

| | | | |
|---|---|---|---|
| 4,007,478 | 2/1977 | Yagi | 257/336 |
| 4,070,687 | 1/1978 | Ho et al. | 257/327 |
| 4,291,321 | 9/1981 | Pfleider et al. | 257/336 |
| 4,635,085 | 1/1987 | Taguchi | 257/306 |
| 4,876,213 | 10/1989 | Pfiester | 257/408 |
| 4,928,163 | 5/1990 | Yoshida et al. | 257/346 |
| 5,208,470 | 5/1993 | Lee et al. | 257/306 |
| 5,352,914 | 10/1994 | Farb | 257/345 |

FOREIGN PATENT DOCUMENTS

| | | | |
|---|---|---|---|
| 0037055 | 2/1989 | Japan | 257/408 |

Primary Examiner—Robert P. Limanek
Assistant Examiner—Alexander Oscar Williams
Attorney, Agent, or Firm—Antonelli, Terry, Stout & Kraus

[57] ABSTRACT

An arrangement is provided to decrease the junction degradation caused by the leakage current at a p-n junction in semiconductor devices. This arrangement can be useful for a variety of devices, and is especially effective for reducing junction degradation at the source or drain region of a MOSFET. To achieve such a reduction, a p-n junction layer is provided at a p-n junction of a semiconductor region and a substrate. Carrier concentration distributions of a p-type layer and an n-type layer of the p-n junction layer are set so that an electric field which tends to be increased by a local electric field enhancement in a depletion layer of the p-n junction due to a precipitate introduced from a semiconductor surface will not exceed 1 MV/cm. When the depth of a depletion layer of the p-type layer or the n-type layer is referred to as Xp or Xn, and the slope of the carrier concentration, Ap or An, the following relation is provided:

$$4.3 \times 10^{12} (/cm^2) \geq An \cdot Xn^2 = Ap \cdot Xp^2$$

Preferably, the p-n junction layer is formed under a contact hole of a source or drain region if the device in question is a MOSFET. As a result of using this arrangement, the leakage current caused by a local Zener effect decreases so that the electric field locally increased by the precipitate will not be greater than 1 MV/cm.

26 Claims, 16 Drawing Sheets

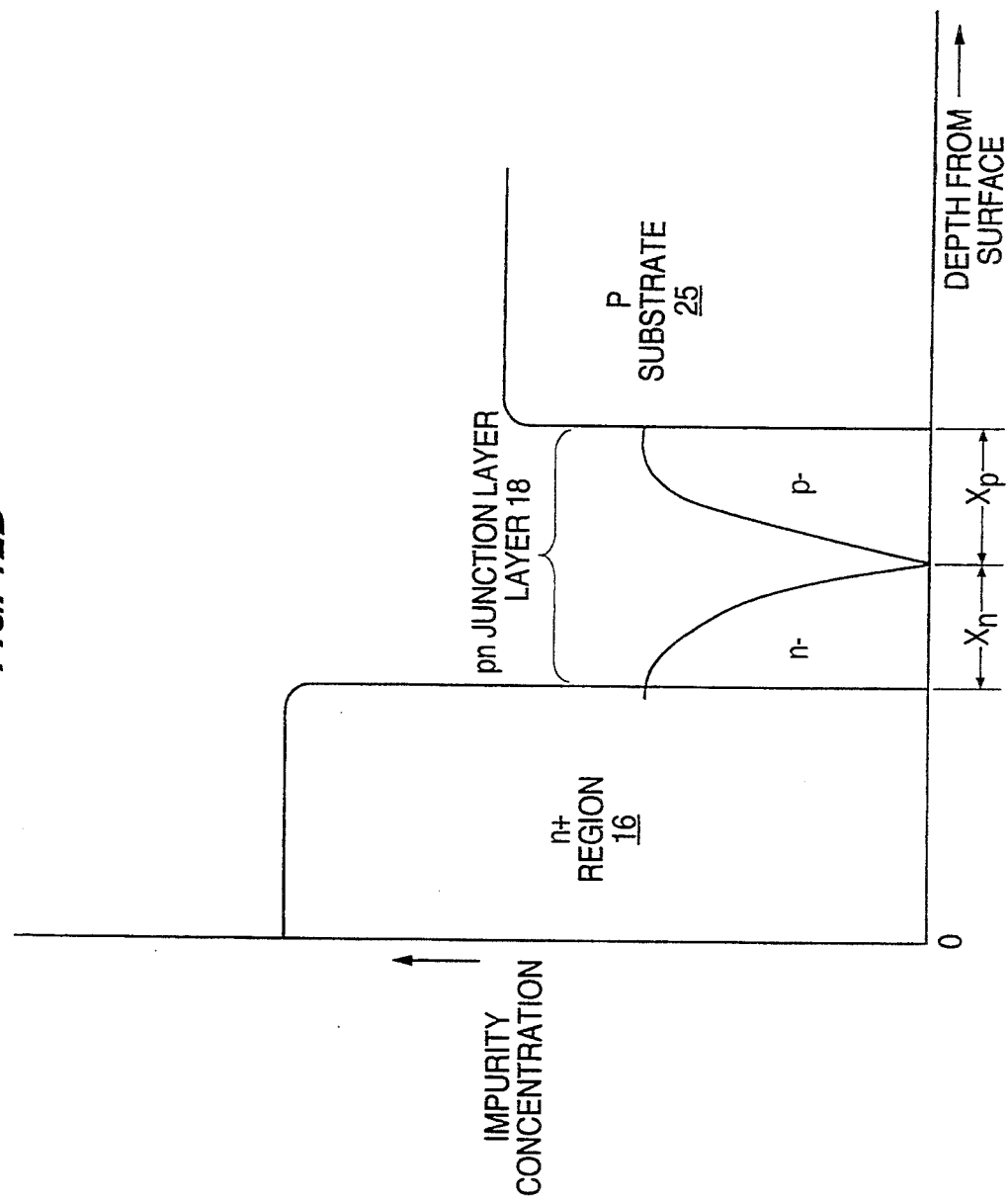

SEMICONDUCTOR DEVICE INCLUDING ARRANGEMENT FOR REDUCING JUNCTION DEGRADATION

BACKGROUND OF THE INVENTION

The present invention generally relates to effectively reducing junction degradation in semiconductor devices, including those provided with a MOSFET, and more particularly to a semiconductor integrated circuit device capable of effectively reducing junction degradation caused by an increase in a leakage current at the p-n junction in a source region or a drain region of a MOSFET so that miniaturization of the semiconductor device can be expedited.

A conventional semiconductor device of the type disclosed in Japanese Patent Laid-Open No. 174721/1991 has been so arranged that the depth of the p-n junction is made shallow. In this particular device, the p-n junction is formed between a layer of one conductivity type which is a high carrier concentration layer containing impurities of not less than $10^{19}/cm^3$ and a layer of another conductivity type which is a low carrier concentration layer containing impurities of not more than $10^{18}/cm^3$.

In order to improve hot carrier immunity of MOSFETs, there have been employed in the past such arrangements as an LDD (Lightly Doped Drain) structure, as disclosed in Japanese Patent Laid-Open No. 242078/1986, and a double diffused drain structure, as disclosed in Japanese Patent Laid-Open No. 72272/1985. In these structures, the intended object has been accomplished by relaxing the electric field at the drain junction edge on the silicon surface.

Further, as disclosed in Japanese Patent Laid-Open Nos. 15465/1988, 280322/1990 and 62573/1991, a combination of LDD and double diffused drain structures has also been employed. The object of such a combination is to prevent an increase in junction leakage current due to dry etching or impairment of ion implantation for the high concentration layer formation by surrounding a damaged portion, resulting from the dry etching when the LDD structure is prepared, with a high concentration layer or a low concentration layer of the double diffused drain structure.

On the other hand, it has heretofore been employed to improve the junction breakdown voltage by relaxing the electric field biased to the p-n junction so as to make a carrier concentration profile on the high concentration side a graded junction as disclosed in Japanese Patent Laid-Open Nos. 188925/1990 and 201970/1990.

Further, as disclosed in Japanese Patent Laid-Open Nos. 244640/1990 and 177570/1990, an abrupt junction and a graded junction are combined in a plane fashion to effect the electric field relaxation on the periphery of the junction.

Still further, as disclosed in Japanese Patent Laid-Open Nos. 124713/1983 and 73669/1988, a high concentration buried layer of a conductivity type opposite to that of the source/drain diffused layers is formed in a portion deeper than the source/drain diffused layers to prevent punch through at the MOSFET.

The junction of a typical conventional semiconductor device has been formed near the semiconductor substrate surface where damage and metal contamination tend to occur frequently since they are introduced during the process of manufacturing such a semiconductor device, including ion implantation at the time of impurity doping or dry etching at the time of insulator processing.

In other words, the junction has such a concentration profile that the damage caused thereto and the degree of contamination tend to remain high, but decreases in proportion to its depth from the surface. Thus, if the position of the p-n junction formation is made shallow gradually from the semiconductor substrate surface as conventionally practiced, a depletion layer will contain a great deal of damage and contamination when the reverse bias voltage is biased to the p-n junction. Therefore, it is likely that the frequency of leakage current degradation of the p-n junction will become high.

Two known sources of leakage current are (1) leakage current through a generation-recombination center in a depletion layer, and (2) leakage current through a surface state in a portion where the depletion layer terminates at the semiconductor substrate surface. The present inventors have discovered that in addition to these two known sources, there also exists (3) a leakage current resulting from a local Zener effect generated at the periphery of a precipitate other than the semiconductor substance in the depletion layers generated when a p-n junction is reverse biased.

The leakage currents of the above-noted effects (1) and (2) are generated by the generation-recombination center and the surface state which are generated by the effects of damage and contamination introduced in the process of manufacturing the semiconductor. Thus, for example, if the p-n junction becomes shallow, the depletion layer also correspondingly becomes shallow, and the leakage current of the above effect (1) tends to increase. If the depletion layer of the p-n junction becomes wide, the volume of the depletion layer and the contact area with the semiconductor substrate surface increase correspondingly, and the leakage currents of the above effects (1) and (2) increase.

The leakage current of the above effect (3) is generated by a local Zener effect, which depends on the type of the precipitate. The Zener effect is generated at the periphery of the precipitate, and is generated by not only the effects of the above damage and contamination but also the effects of physical properties of the semiconductor substrate itself. Such a phenomenon will be described below.

If, in a semiconductor substrate, there exists a precipitate having a dielectric constant different from the dielectric constant of the semiconductor, a local electric field enhancement such as shown in FIG. 1 will be caused in a constant electric field. Typically, the term "contaminant" refers to a substance having a size on the atomic level (e.g., an ion), whereas "precipitate" refers to a substance having particles in a range typically between 50 Å and 500 Å, although the invention is not limited to this. In FIG. 1, the local electric field enhancement in silicon is indicated. However, in the case of an oxygen precipitate, which can be regarded as an $SiO_2$ ball, and a metal precipitate, which can be regarded as a metal ball, local electric field enhancements of at most 1.3 times and 3 times, respectively, are caused. Of course, various other precipitates are possible. These are determined by the types and degree of the damage and contamination introduced in the semiconductor production steps, or by the degrees of the oxygen concentration or point defect concentration of the semiconductor substrate itself to be used.

When such local electric field enhancement is caused, a band-to-band tunneling effect is locally caused, as disclosed in "A Theory of Electrical Breakdown of Solid Dielectrics", Proc. Roy. Soc., vol. A145 (1934), pp. 523, by Zener et al. A tunneling probability P (/s) in the case of a silicon substrate is represented by $1.35 \times 10^7 \times E(V/cm) \times \exp(-2.14 \times 10^7/E(V/cm))$ by a cgs unit system.

Thus, the tunneling probability in the case of the local electric field enhancement (called local Zener probability herein to distinguish it from usual tunneling probability) may be obtained by making the electric field E several times greater by the formula of the above tunneling probability P(/s). The magnifying power depends on the precipitate, as shown in FIG. 1. The present inventors have proved this phenomenon as follows.

At first, an oxygen precipitate and a metal precipitate were incorporated into a silicon substrate for the production of a p-n junction, and then an abrupt junction was prepared with a p-type low concentration $(1.6 \times 10^{16}/cm^3)$ layer and an n-type high concentration $(1 \times 10^{20}/cm^3)$ layer. A reverse bias was applied to the p-n junction and the leakage current was measured to see an increase as compared with the leakage current of the p-n junction when the above two types of precipitates are not introduced.

As a result, the leakage current increased by the introduction of the precipitate, as shown in FIG. 2. In this figure, the two auxiliary lines are the electric field dependency of the local Zener probability when the $SiO_2$ precipitate and the metal precipitate were supposed. Namely, when the introduction of the precipitate is conducted, it is apparent that a leakage current increase by the metal precipitate is caused on the low electric field side and a leakage current increase by the $SiO_2$ precipitate is caused on the high electric field side. Here, the incorporated amount and the incorporation distribution of the precipitate, are not controlled. However, this figure indicates the electrical field dependency of the leakage current increase corresponding to the dielectric constant of the precipitate intentionally incorporated. It is also evidenced that the band-to-band tunneling effect is locally caused in usual electric fields.

Taking into consideration the causes of the p-n junction degradation including the above-mentioned new leakage current, the conventional semiconductor devices have the following problems to be solved. First, in the LDD structure, since most regions of a source/-drain junction of a MOSFET are a combination of a high concentration layer and a low concentration layer, if the junction depth is made challowor to be adapted for further miniaturization, the leakage currents of the above effects (1) and (3) tend to increase. In other words, when the damage and contamination introduced in the semiconductor production steps are distributed in such a manner that they tend to be very high at the surface and decrease with the depth, the generation-recombination centers increase correspondingly to such an extent that the depletion layer is made shallow on the substrate surface. Thus, a major part of the electric field becomes closer to the portion in which a large amount of precipitates exist.

Next, in the double diffused drain structure, the leakage current of the above effect (3) can be reduced to the extent of relaxation of the electric field in the low concentration region. However, this is simply due to expanding the width of the depletion layer. As a result, the leakage currents of the above effects (1) and (2) will be increased correspondingly. Further, this double diffused drain structure has a problem of intrusion of a diffused layer beyond the gate electrode edge, and, therefore, is not suitable for miniaturization. Further, such a structure is not suitable for miniaturization from the viewpoint of controllability of the intrusion. Since the effect of the electric field relaxation in the double diffused drain structure is an electric field relaxation only at the high concentration layer side, a relaxation effect of about only 10% can be obtained as compared with the LDD structure.

In an arrangement combining the LDD structure and the double diffused drain structure, the increase of the leakage current of the above effect (3) can be prevented similar to the double diffused drain structure. However, the leakage currents of the above effects (1) and (2) will be increased similarly, which is, of course, unsuitable for miniaturization of the structure. A problem newly posed in this structure is that since the low concentration layer of the double diffused drain structure overlaps the low concentration layer of the LDD structure, it becomes difficult to control the concentration at the gate electrode edge as a measurement for hot carriers. That is, if the introduction of two different impurities results in respective scatterings, double scatterings will be caused. In this case, the electric field relaxation is only at the high concentration layer and therefore the obtained effect is only at the level of the double diffused drain.

Further, in a structure wherein the high concentration layer side is made a graded junction to improve the junction breakdown voltage and the hot carrier immunity, since the width of the depletion layer becomes large, similar to the case of the above double diffused drain structure, the leakage currents of the above effects (1) and (2) increase. Further, since the part to be depleted becomes closer to the substrate surface, not only the leakage currents of the above effects (1) and (2) but also the leakage current effect (3) are not ignorable in the part of the low electric field as well. To avoid this, there is only a method wherein the high concentration layer is formed in the deeper portion, such being unsuitable for miniaturization. In this connection, the obtained effect of the electric field relaxation in this case becomes large to such an extent that the depletion layer is widened. However, if it is practiced to adapt this structure to a miniaturization level, similar to the various above-mentioned structures, the obtained relaxation effect is eventually only about 10% as compared with the LDD structure, similar to the above structure.

There are not only structures having the depth direction distribution changed but also structures having the horizontal direction distribution changed from the plane viewpoint. However, in the latter structure, since the surface area of the so-called depletion layer is increased, the junction degradation due to the leakage current of the above effect (2) is increased, and since there are still junctions of a simple combination of the high and low concentration layers, it is impossible to avoid the p-n junction degradation by the leakage current of the above effect (3). Further, such a combination of junctions having different distributions from each other from the plane viewpoint is quite unsuitable for miniaturization.

Although a description has been given of distribution on the high concentration layer side, problems of conventional semiconductor devices with the distribution on the low concentration side changed will be described further.

In a structure having a high concentration buried layer which is provided at the deep part of the low concentration layer side to prevent the punch-through phenomenon in a MOSFET, the depletion layer of the above p-n junction is hardly widened by the effect of the high concentration buried layer. The smaller the depletion layer width at the same reverse bias, the larger the electric field in the depletion layer. By such a structure, the leakage current of the above effect (3) will increase. Further, the depletion layer will widen to the high concentration layer side at the surface side corresponding to such an extent that it is suppressed by the high concentration buried layer, and thus the leakage current of the above effect (1) will increase.

As mentioned above, the conventional semiconductor devices have problems that any one of the leakage currents of the above effects (1) to (3) which cause the p-n junction degradation, will increase. If the leakage currents of the above effects (1) and (2) are to be decreased, the leakage current of the above effect (3) will increase. If the leakage current of the above effect (3) is to be decreased conversely, the leakage currents of the above effects (1) and (2) will increase, such being unsuitable for miniaturization. Further, if the electric field relaxation occurs only at the high concentration layer side, the effect is about 10% at most, and thus only a small beneficial effect is obtainable against the reduction of the leakage current of the above effect (3).

Further, the conventional formation of the high concentration buried layer on the low concentration layer side leads to an increase of the electric field, and it is impossible to remove the effects of the electric field while adapting to miniaturization with respect to all of the conventional semiconductor devices mentioned above. Since no consideration was given in the prior art to the effect of precipitates and the effect of their distribution, no satisfactory measurement for the leakage failure of the p-n junction was practiced.

SUMMARY OF THE INVENTION

It is an object of the present invention to provide a semiconductor device which solves the problems of the conventional semiconductor devices while efficiently reducing the p-n junction leakage failure resulting from the leakage current of the above effects (1) to (3), and which is also readily adaptable for miniaturization.

To accomplish the above and other objects, a semiconductor device according to the present invention has a p-n junction layer satisfying the following conditions.

Conditions: The depth of depletion layers of the p-n junction extending toward a p-type layer and an n-type layer are $Xp$ (cm) and $Xn$ (cm), respectively, and a slope of a carrier concentration of the p-type layer and the n-type layer are $Ap$ (/cm$^4$) and $An$ (/cm$^4$), respectively, and the values of $Xp$, $Xn$, $Ap$ and $An$ are set so that the following relationship would be satisfied between these constants, $$4.3 \times 10^{12}/cm^2 > An \cdot Xn^2 = Ap \cdot Xp^2$$

Specifically, the depth $Xp$ (cm) of the depletion layer of the p-type layer and the depth $Xn$ (cm) of the depletion layer of the n-type layer are set by $Ap$ (/cm$^4$) and $An$ (/cm$^4$), which are the slopes of the carrier concentrations of the p-type layer and the n-type layer, when the maximum reverse bias voltage is applied to the p-n junction layer.

When the p-n junction layer is a p-n junction layer in the drain region of such a MOSFET, the above-mentioned maximum reverse bias voltage is the voltage of the power supply, supplied to the drain region.

The semiconductor device of the present invention, defined from another aspect, is characterized in that respective carrier concentration profiles of the p-type layer and the n-type layer, which form a p-n junction, are set in such a manner that when a maximum reverse bias voltage is biased to the p-n junction, an electric field caused by a local electric field enhancement due to a precipitate different from a semiconductor substance in a depletion layer in the p-n junction, is at the level of not more than 1 MV/cm, to accomplish the above object.

BRIEF DESCRIPTION OF THE DRAWINGS

FIG. 12B shows an impurity distribution for certain regions of the structure shown in FIG. 12A;

DETAILED DESCRIPTION OF THE INVENTION

First, the operation of a p-n junction layer satisfying the above conditions will be described. The maximum electric field in the region to be depleted is calculated by using the constants as indicated above to find $(q \cdot An \cdot Xn^2)/2\epsilon$ or $(q \cdot Ap \cdot Xp^2)/2\epsilon$. Here, q is an electronic charge $(1.6 \times 10^{-19}$ C), and $\epsilon$ is a dielectric constant of a semiconductor substrate ($\epsilon = 11.8 \times \epsilon_o$, where $\epsilon_o = 8.85 \times 10^{-14}$ F/C). Thus, the maximum electric field is proportional with the area of the space charge profile contained in the depletion layer since the space charge profile changes from zero to $q \cdot An \cdot Xn$ or $q \cdot Ap \cdot Xp$ between the distance Xn and the distance Xp so that the maximum electric field is $(q \cdot An \cdot Xn^2)/2\epsilon$ or $(q \cdot Ap \cdot Xp^2)/2\epsilon$.

On the other hand, since the above-mentioned Zener effect is remarkable when the electric field exceeds 1 MV/cm, it is necessary to keep the electric field at a level under this value. Thus, to prevent the increase of the leakage current by the local Zener effect, the electric field should not exceed 1 MV/cm even if the local electric field enhancement occurs. Thus, if the maximum local electric field enhancement is 3 times, it is necessary to keep the electric field at most not more than 0.333 MV/cm when no precipitate forms. Here, if the semiconductor substrate is made of silicon, to prevent the increase of the leakage current by the local Zener effect, it is necessary to keep $(An \cdot Xn^2)$ or $(Ap \cdot Xp^2)$ at the level of not more than $4.3 \times 10^{12}$(/cm$^2$).

Figure 1:
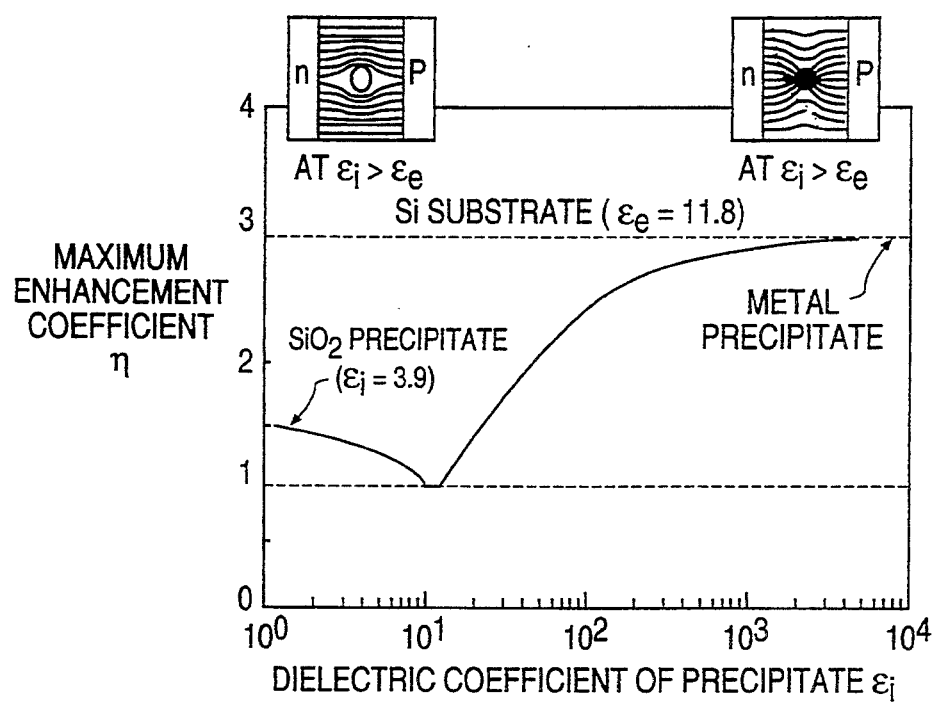
FIG. 1 is a graph showing local electric field enhancement in the depletion layer of a p-n junction of silicon.
Figure 2:
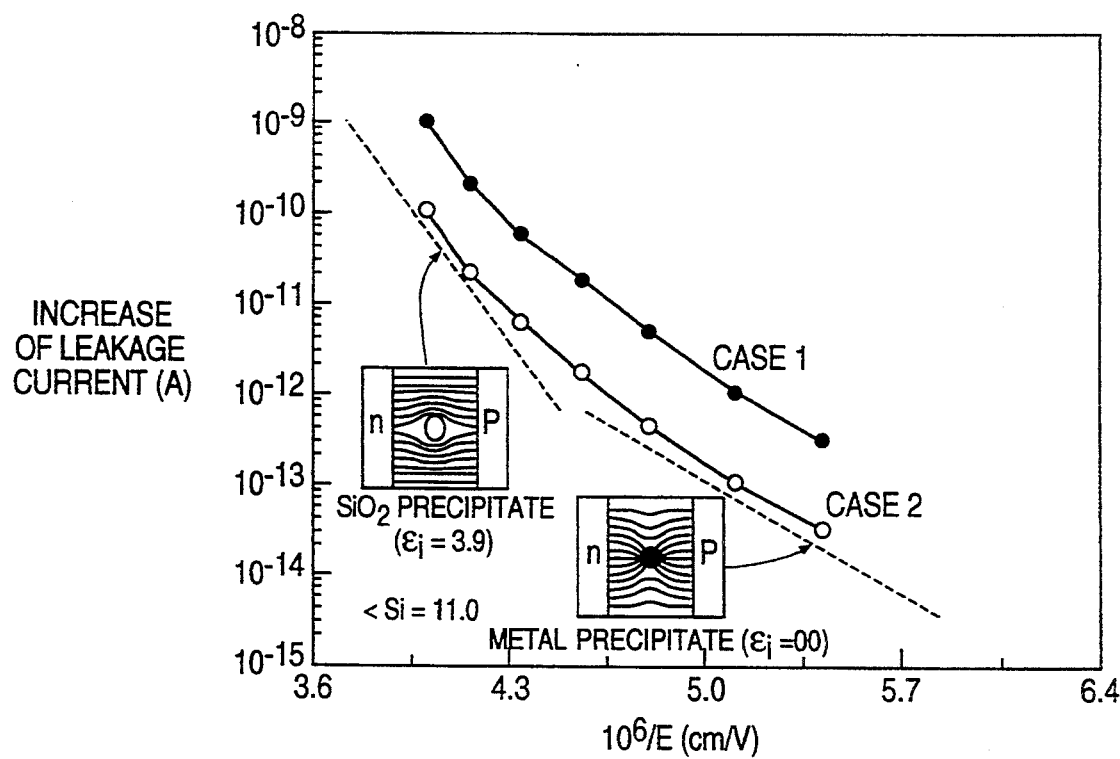
FIG. 2 is a graph showing the increase of leakage current brought about by local Zener effect caused by the local electric field enhancement.
Figure 3:
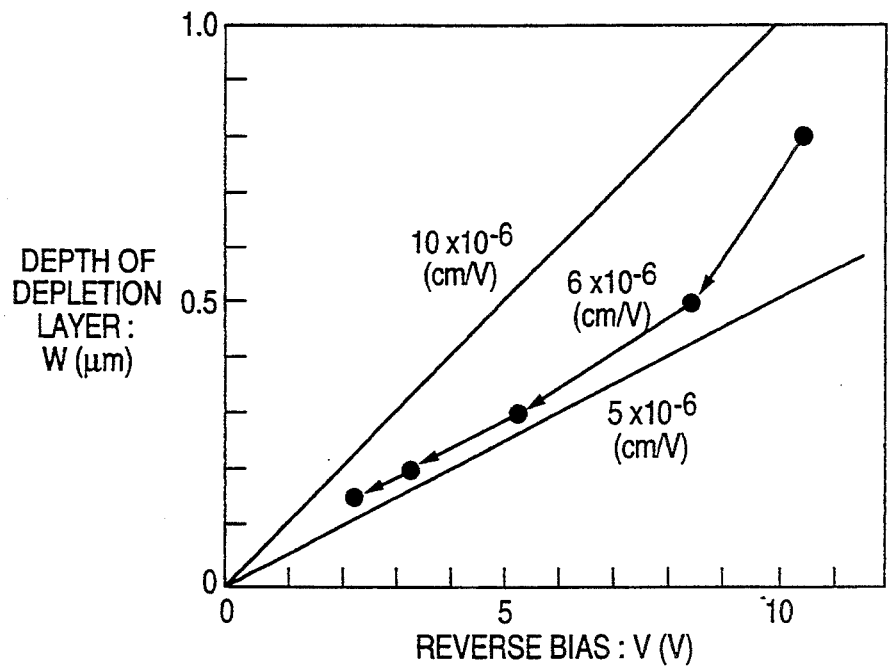
FIG. 3 is a graph showing the relationship between the depth of the depletion layer of the p-n junction and the reverse bias.

Next, there is no realistic possibility of adapting to miniaturization if the relation between the depth W (sometimes referred to in the art as "depletion layer width") of the depletion layer of the p-n junction layer and the reverse bias V is not consistent with the scaling law of miniaturization heretofore described. The relation between W and V can be approximately described as $W = 6 \times 10^{-6}$ (cm/V)$\times (\phi + V)$ as shown in FIG. 3. Here, from the circumstance heretofore and the expectation hereafter, the relation is substantially represented by $W = (5 \text{ to } 10) \times 10^{-6}$ (cm/V)$\times (\phi + V)$ where $\phi$ is a built-in potential and V is a reverse bias voltage. Here, since W is the sum of Xp and Xn which are the depths of the depletion regions in the p-type layer and n-type layer to be depleted, the above relation can be represented by $(Xp + Xn) = (5 \text{ to } 10) \times 10^{-6}$ (cm/V)$\times (\phi + V)$. Thus, if the above conditions are satisfied in conformity with such a relation, it is possible to adapt to miniaturization while preventing the increase of the leakage current by the local Zener effect.

As an operation when the above conditions and the relation between the depth of the depletion layer and the electrical potential, are satisified at the same time, an electric field relaxation effect of 25% relative to the electric field in the case of the abrupt junction can be obtained when the depletion layer depth W the reverse bias V are unchanged. That is, this is because that the maximum electric field in the case of the abrupt junction is 2 $(\phi + V)/W$, while that of the p-n junction layer is 1.5 $(\phi + V)/W$. This relation formula is obtained as follows.

First, in the case of the abrupt junction, the maximum electric field is $q \cdot N \cdot W/\epsilon$, and the potential $(\phi + V)$ is $(W^2 \cdot q \cdot N)/2$. Here, N is the concentration on the low concentration side. Next, in the case of the p-n junction layer of the above graded junction, potential is $q \cdot An \cdot Xn^3 \cdot (1 + \sqrt{(An/Ap)})/3\epsilon$ or $q \cdot Ap \cdot Xp^3(1 + \sqrt{(Ap/An)})/3\epsilon$. Here, Xn + Xp is equal to W. For simplification, if An = Ap = A and Xn = Xp = W/2 are supposed, the maximum electric field is $q \cdot A \cdot (W/2)^2/2\epsilon$, and $(\phi + V)$ is $q \cdot A \cdot (W/2)^3 \cdot 2/3\epsilon$, and therefore the above relation formula can be obtained.

Figure 4:
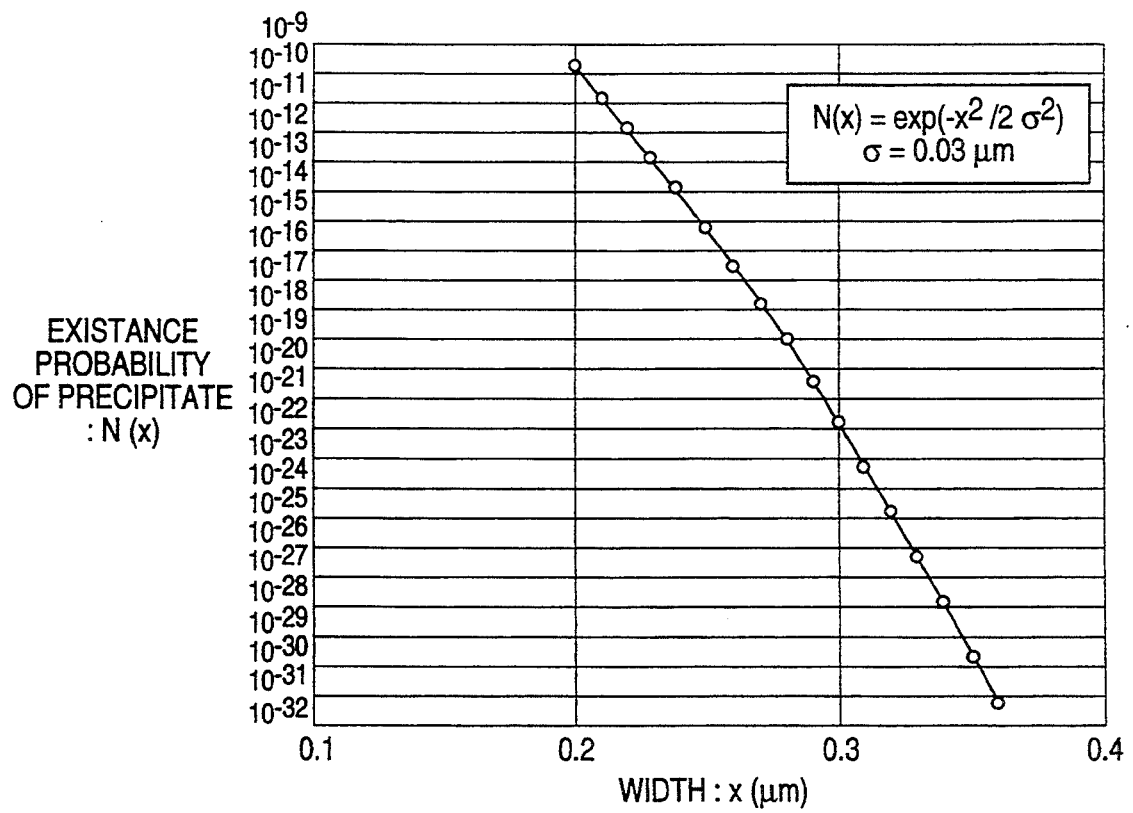
FIG. 4 is a graph showing the existence probability distribution of a precipitate in the substrate.

When the p-n junction layer satisfying the above-mentioned relation is obtained, the p-n junction degradation due to the local Zener effect can be reduced by the following operation. Here, if the existence probability of the precipitate is represented as a function of a depth, and the probability at the substrate surface is made 1, the depth direction distribution N(x) is represented by exp $(-x2/2\sigma^2)$. For example, since the average depth of damages introduced by the dry etching step is mainly several tens of nm, if it is supposed to be 30 nm in terms of the standard deviation a which represents the depth of the above distribution, it will be the distribution of the existence probability of the precipitate, as shown in FIG. 4.

Figure 5:
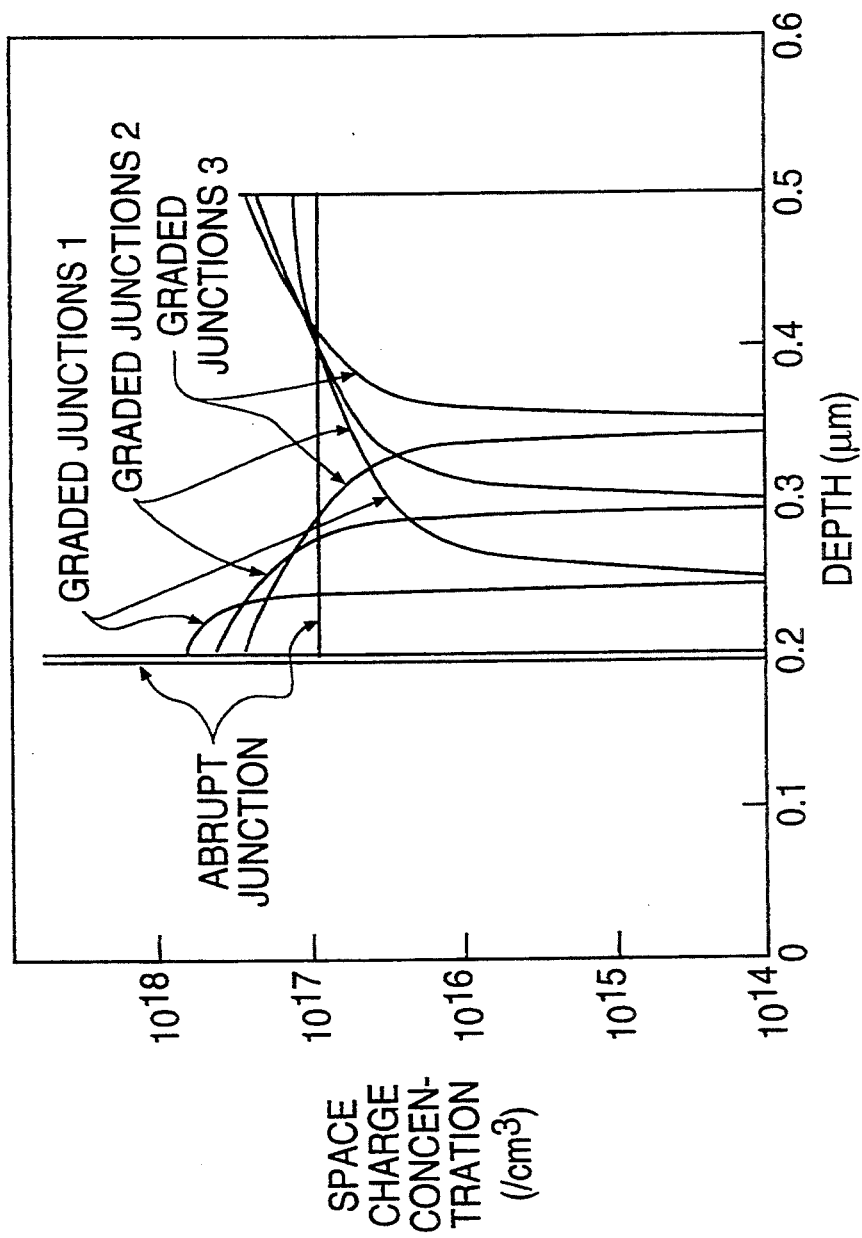
FIG. 5 is a graph showing the space charge profile in the depletion layer of the p-n junction.

On such a semiconductor substrate, if a high concentration layer is formed to the depth of 200 nm from the substrate surface, and the depth of the depletion layer is 300 nm with the reverse bias of 5.3 V, then the plurality of combinations of space charge profiles shown in FIG. 5 is obtained. This is equal to the so-called carrier concentration profile. Here, such profiles are obtained with respect to the case of the abrupt junction and the case of three graded junctions. That is, what is meant by the p-n junction layer of the above graded junction in the present invention, is that when the high concentration layer side is made a graded junction, the low concentration layer side is also made a graded junction to satisfy the above conditions. From the space charge profile obtained in FIG. 5, the electric field distribution as shown in FIG. 6 is obtained.

Figure 6:
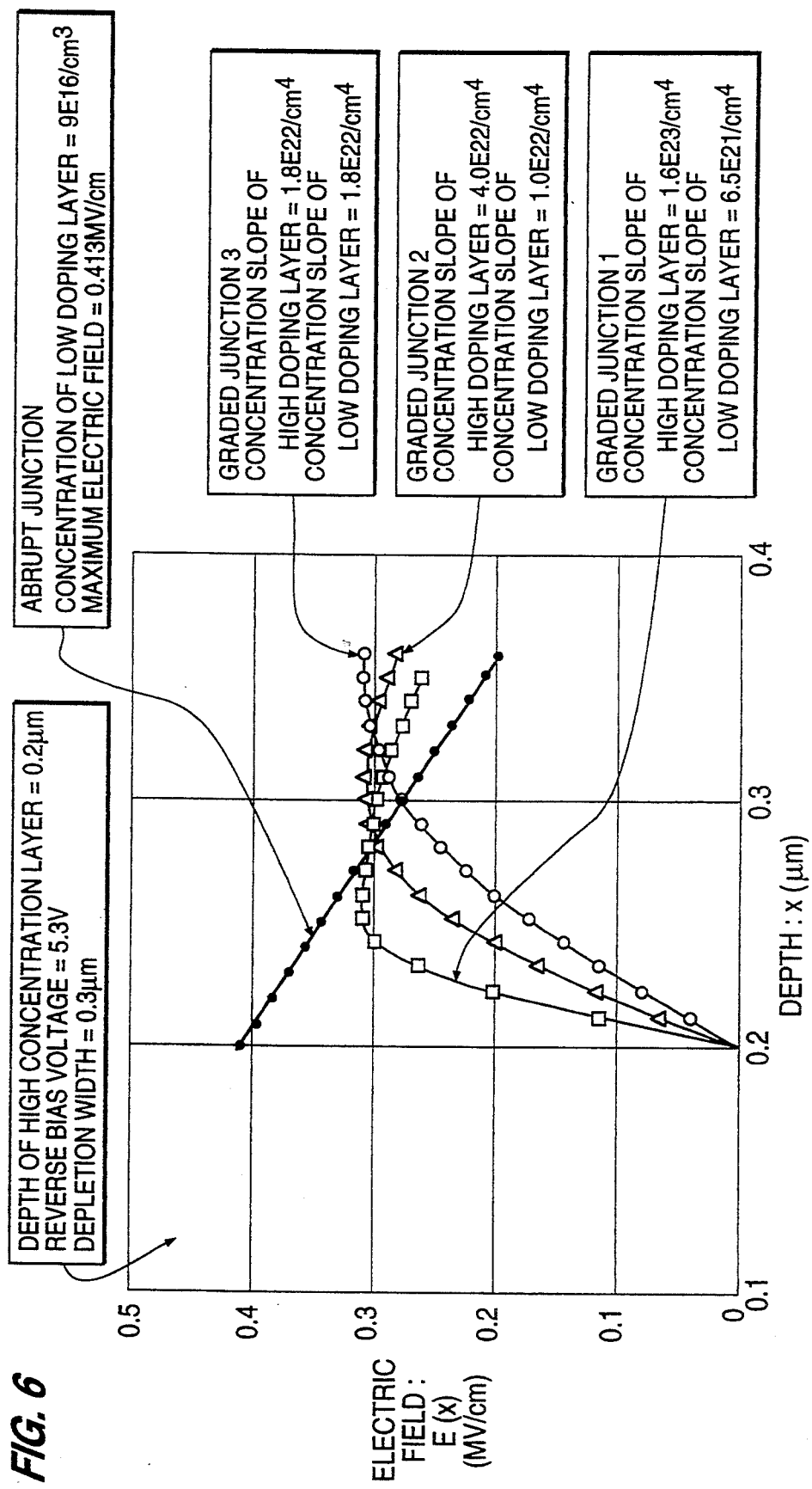
FIG. 6 is a graph showing the distribution of the electric field in the depletion layer of the p-n junction.

As is known from FIG. 6, the p-n junction layer of the present invention can reduce the maximum electric field by 25% as compared with the abrupt junction, and has an electric field relaxation effect of at least twice that of the conventional arrangements. Further, under the state that the above conditions are satisfied, the electric field distribution can be optionally changed without changing the maximum electric field.

Figure 7:
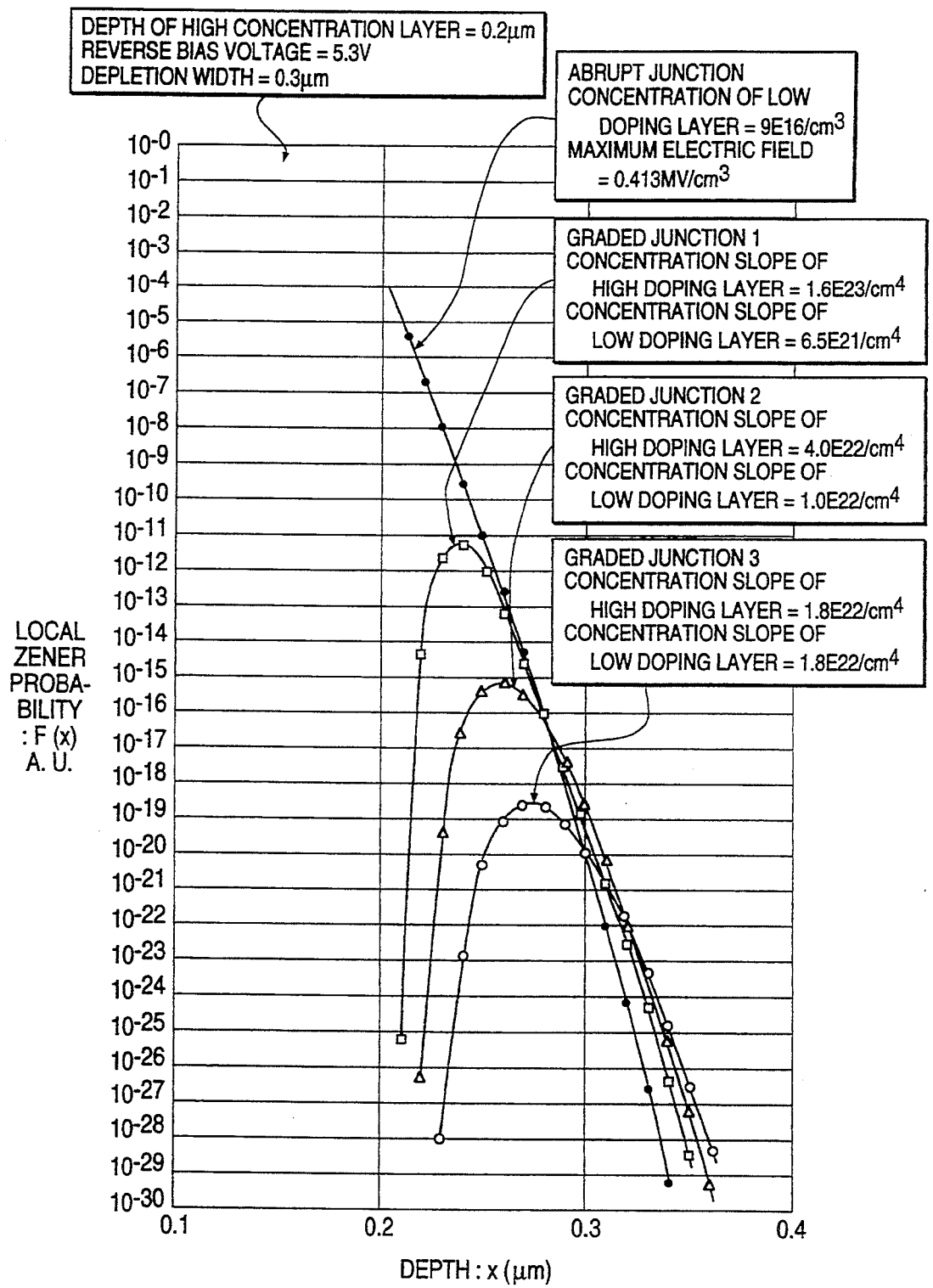
FIG. 7 is a graph showing the local Zener probability distribution in the depletion layer of the p-n junction.

The effect of the change of the electric field distribution appears in the local Zener probability distribution as shown in FIG. 7. The data of FIG. 7 are obtained as the product of the existence probability distribution of the precipitate as shown in FIG. 4, and the local Zener probability when the electric field distribution as shown in FIG. 6 is affected by the electric field enhancement by which the electric field distribution will be increased to at most 3 times by the precipitate. As is understood from this figure, by changing from the abrupt junction to the graded junction, the local Zener probability can be minimized to around the seventh decimal place. Further, even in the case of the graded junction, by changing the slopes of the carrier concentration distributions at the high concentration layer side and the low concentration layer side, the local Zener probability can be reduced to a great extent. What is important here is that these local Zener probability distributions can be practiced without changing the depth of the depletion layer. This means that the p-n junction degradation by the local Zener effect can be reduced without preventing miniaturization. This is a substantial effect which is not obtained by conventional semiconductor devices.

The operation of the present invention will now be described with reference to FIGS. 8 to 11, from the viewpoint of three leakage currents which cause the p-n junction degradation.

Figure 8:
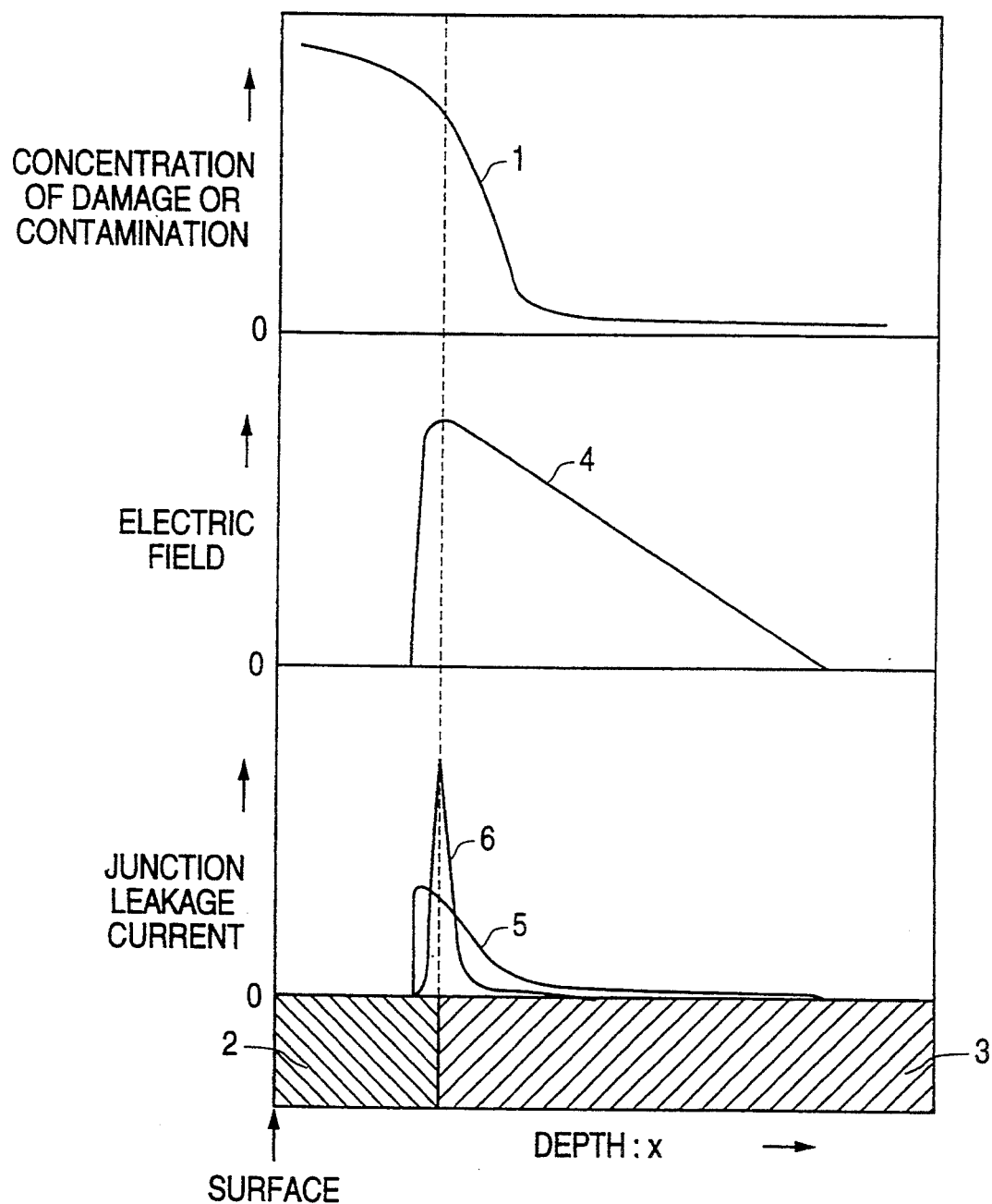
FIG. 8 is a graph showing the conditions of the damage, contamination concentration distribution, electric field distribution and junction leakage current in the depletion layer of the p-n junction of conventional semiconductor devices.

First, as shown in FIG. 8, in the conventional semiconductor devices, the concentration distribution 1 of the damages or contamination which are usually high at the substrate surface and low with the depth from the surface, unexpectedly exist. These damages and contamination form the generation-recombination center and the surface state in the depletion layer or at the depletion layer surface, and form a precipitate reflecting the properties of the semiconductor substrate itself. Thus, the distribution of the damages and contamination distribution as shown in FIG. 8 approximately represent the above generation-recombination center, the surface state and the distribution of the precipitate. Therefore, it is conceivable that they may represent the generation distribution of the generation-recombination current (g-r current), the surface generation current, and the above local Zener current. Like the conventional semiconductor devices, when a reverse bias is biased to a p-n junction constituted of a high concentration layer 2 of a first conductivity type and a low concentration layer 3 of a second conductivity type, under the electric field strength distribution 4 which becomes maximum at the high concentration layer side where the concentration of the damages and contamination are high, a current flows as a junction leakage current which is the sum of the current distribution 6 by the local Zener effect in addition to the current distribution 5 constituted of the g-r current and surface generation current which correspond to the concentration distribution 1 of the damages and contamination. Here, if the concentration distribution 1 of the damages or contamination is supposed to be $Nt(x)$, $It(x)$ as the current distribution 5 corresponding thereto is equal to $B\int Nt(x)dx$. Further, in the local Zener effect found at this time, if the electric field strength distribution 4 is supposed to be $E(x)$, $Iz(x)$ as the current distribution 6 is equal to $C\int Nt(x)E(x)\exp(-D/E(x))dx$. Here, B is a constant determining a current amount generated per damage or contamination, C is constant determining a local Zener current amount generated per damage or contamination, and D is a constant determining a local Zener probability. In this connection, the constants B, C and D are determined by the type of the semiconductor and the type of the precipitate. The example in the case of silicon is as mentioned above. Thus, in the conventional semiconductor devices, since the position of the maximum electric field is at the portion where the precipitate concentration is high, failure is likely to occur by the local Zener effect.

Figure 9:
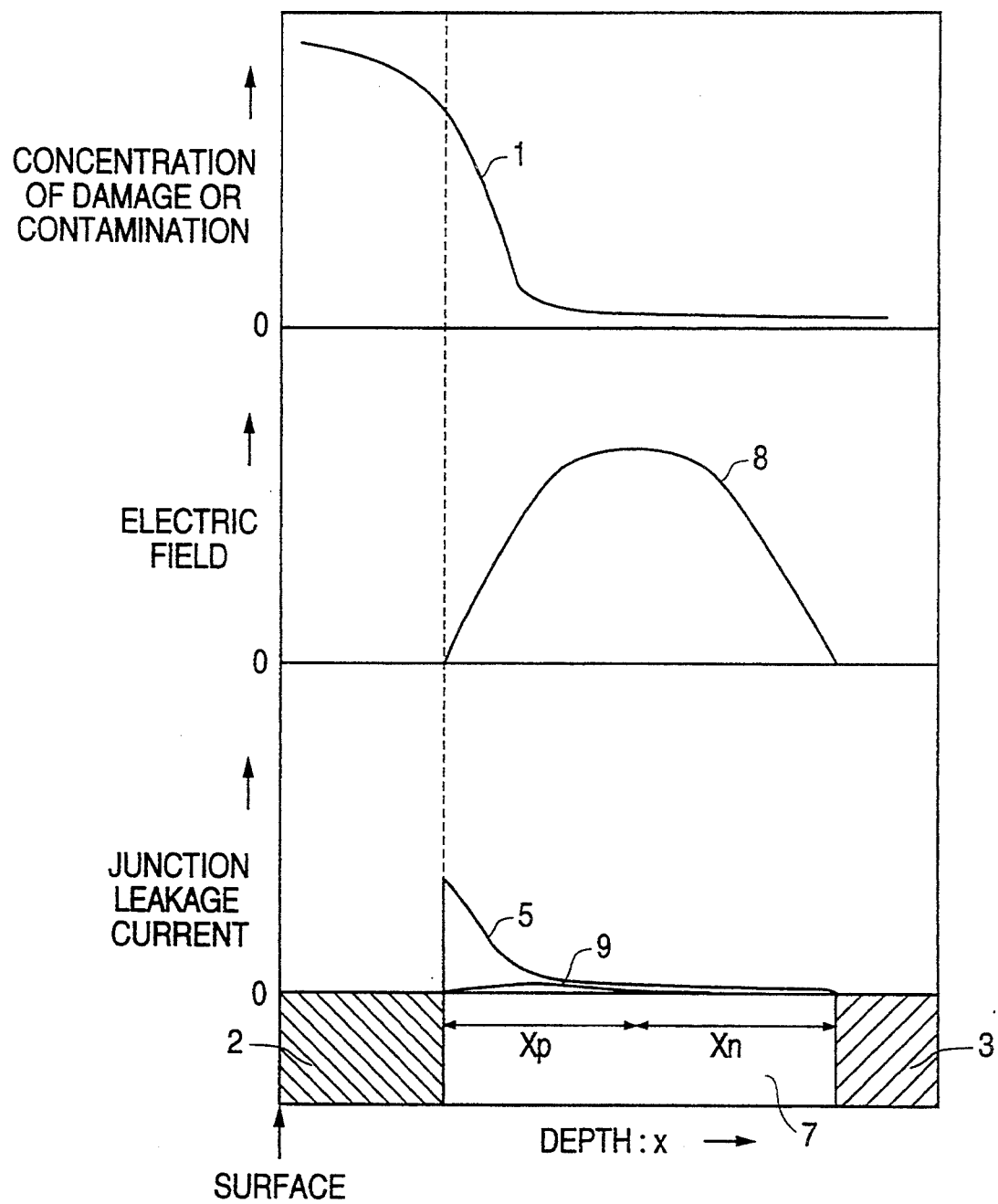
FIG. 9 is a graph showing the conditions of the damage, contamination concentration distribution, electric field distribution and junction leakage current in the depletion layer of the p-n junction of a semiconductor device according to the principle of the present invention.

Contrary to this, in the p-n junction of the graded junction of the present invention as shown in FIG. 9, the junction leakage current is as follows. That is, in a depletion layer 7 of the p-n junction sandwiched with the high concentration layer 2 and the low concentration layer 3, if the above conditions are satisfied to be $(Xn+Xp)/(\phi+V)=6.7\times10^{-6}$ cm/V, $Xp=Xn$, an electric field distribution 8 appears wherein the maximum electric field portion exists in the deep portion. At this time, the junction leakage current has the current amount as the sum of the current distribution 5 which is the sum of the g-r current and the surface generation current, corresponding to the concentration distribution 1 of the damages and contamination similar to the above, and a local Zener current distribution 9 which is extremely smaller than found in the above-discussed case. When the above conditions are satisfied, the local Zener current Iz at the time of Zener breakdown becomes extremely small in proportional to $\exp(-D/E(x))$, to such an extent that the portion of the maximum current field becomes deep. The junction leakage current in this case is thereby a current of only the content obtained by the current distribution 5 which is the sum of the g-r current and the surface generation current, corresponding to the concentration distribution 1 of the damages and contamination. The reason why $4.3\times10^{12}/cm^2 > An\cdot Xn^2 = Ap\cdot Xp^2$ is provided is that if this condition is not satisfied, the local Zener probability abruptly increases and the failure rate greatly increases. Further, at the same time, if $(Xn+Xp)/(\phi+V)$ exceeds $1\times10^{-5}$ cm/V, the depth and the width of the depletion layer becomes large, so that miniaturization is difficult to achieve. If the condition is less than $5\times10^{-6}$ cm/V, the local Zener probability abruptly increases.

Figure 10:
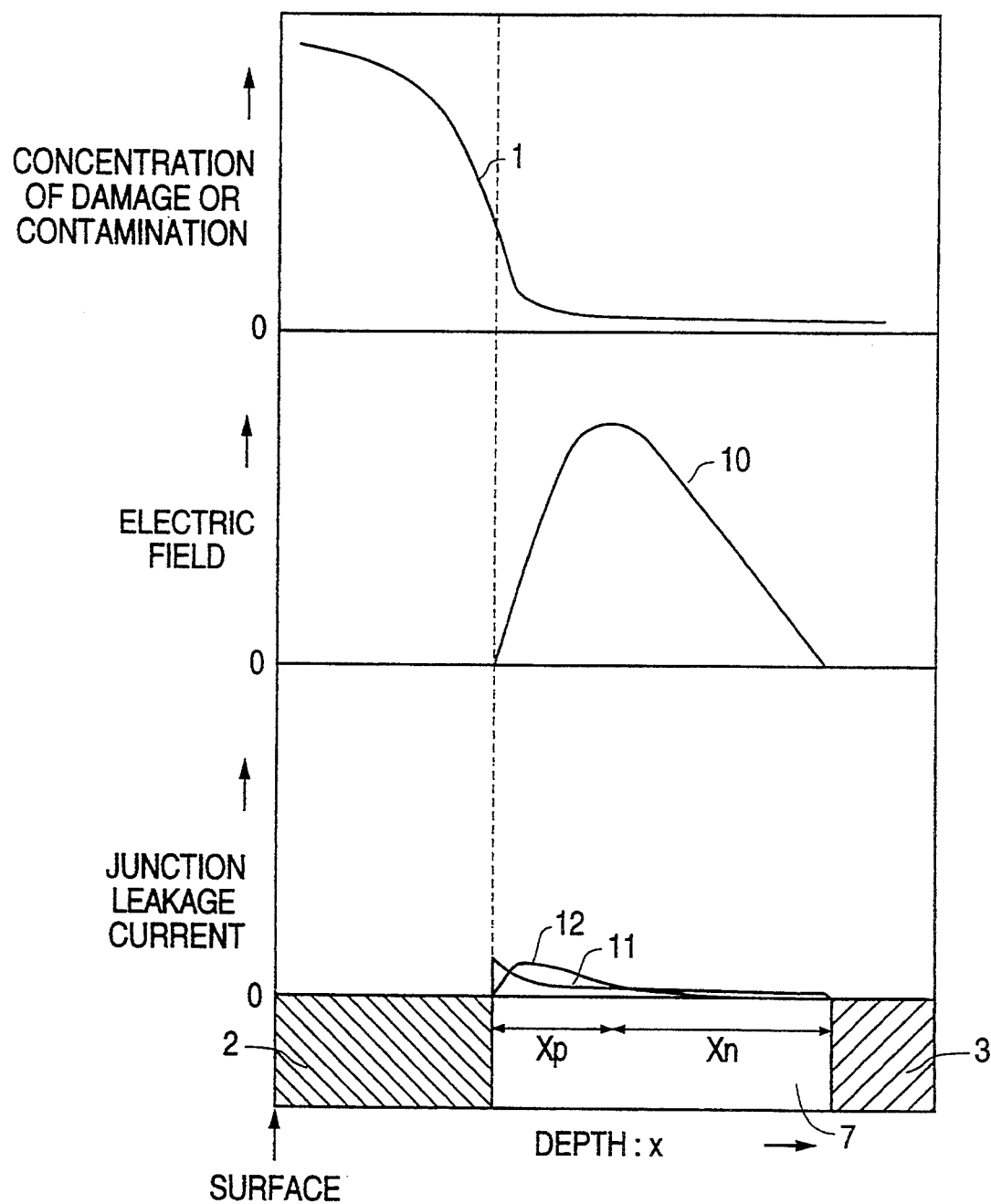
FIG. 10 is a graph showing the conditions of the damage, contamination concentration distribution, electric field distribution and junction leakage current in the depletion layer of another p-n junction of a semiconductor device according to the principle of the present invention.

Further, when the high concentration layer 2 is a p-type, the low concentration layer 3 is an n-type and thereby $Xp/Xn=0.5$, the high concentration layer 2 can be made deep to such an extent as shown in FIG. 10. Thus, the portion to be depleted can be narrowed. At this time, the maximum electric field of an electric field distribution 10 becomes large, but a current distribution 11 by the g-r current and surface generation current, corresponding to the concentration distribution 1 of the damages or contamination similar to the above, can be made smaller than the cases of FIGS. 8 and 9, to such an extent that the depleted region is narrowed. In this case, the maximum electric field distribution 10 becomes larger than FIG. 9. However, the electric field becomes large at the portion where the amount of precipitate is small, and the local Zener current distribution 12 is relatively small even if the electric field is large. The local Zener current distribution 12 is an intermediate distribution between the case of FIG. 8 and the case of FIG. 9. Thus, since the increase of the local Zener current can be substantially ignored in the above formula of Iz, the junction leakage current at this time is the current obtained from the electric field distribution 11 constituted of the g-r current and surface generation current, corresponding to the concentration distribution 1 of the damages and contamination, and, therefore, can be made as small as the sum of both currents. This has a substantial effect when the g-r current or the surface generation current is predominant in the p-n junction degradation.

Figure 11:
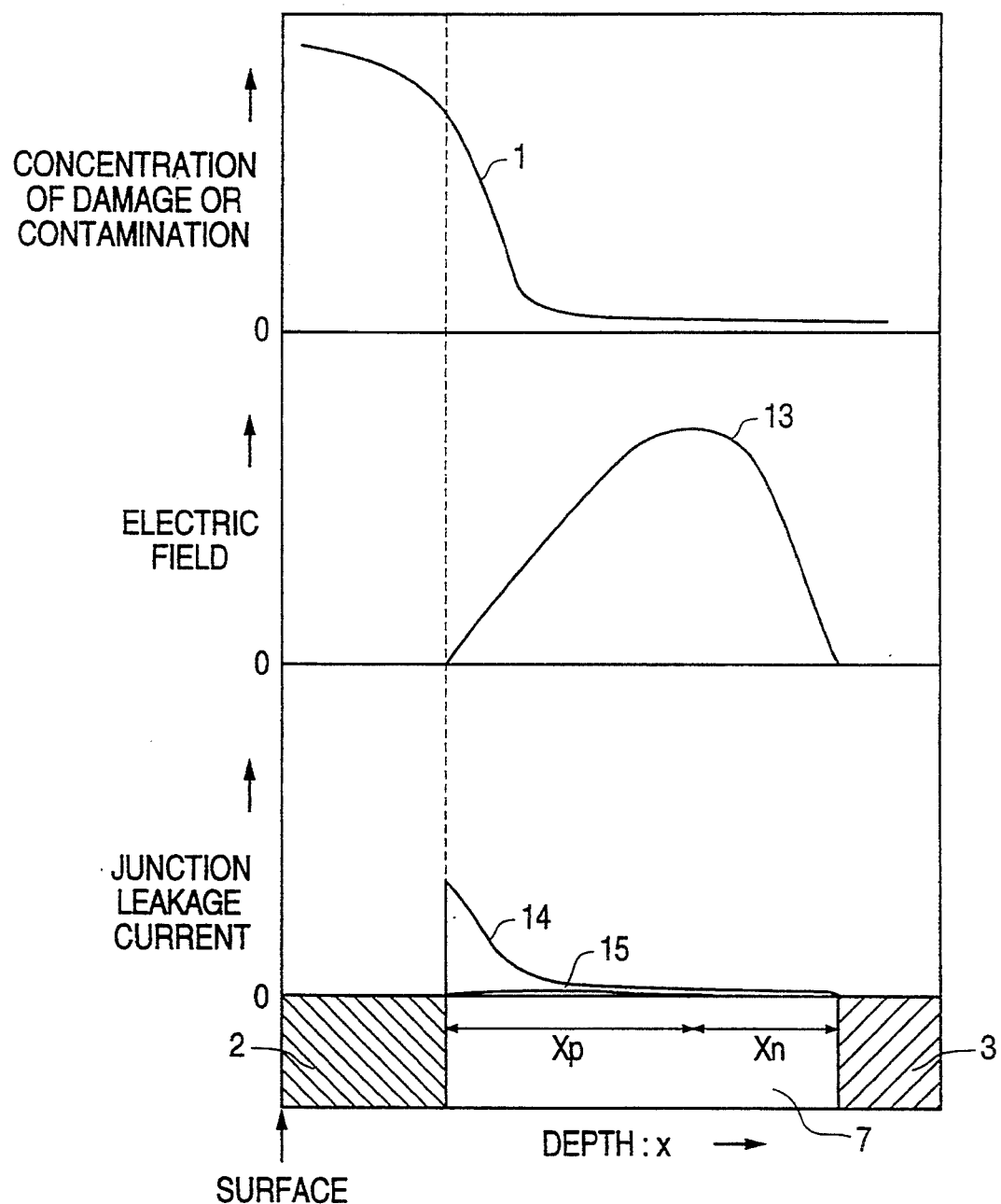
FIG. 11 is a graph showing the conditions of the damage, contamination concentration distribution, electric field distribution and junction leakage current in the depletion layer of yet another p-n junction of a semiconductor device according to the principle of the present invention.

Further, by (Ap/An)=2 as shown in FIG. 11, the portion of the maximum electric field strength in an electric field strength distribution 13 can be made deeper than the case of FIG. 9, contrary to the above. In this case, a current distribution 14 constituted of the g-r current and surface generation current, corresponding to the concentration distribution 1 of the damages and contamination, is similar to the cases of FIGS. 8 and 9, but the local Zener current 15 can be reduced to a level which is substantially negligible. As mentioned above, according to the semiconductor device of the present invention, it is possible to design the p-n junction while paying attention to the leakage current components which are drawbacks in operation.

The slope of the carrier concentration in the above p-n junction layer may not be a complete straight line, and if it deviates from the straight line, the effect of the present invention can be obtained by supposing a substantially straight line in each of the p-type layer and the n-type layer. Further, between the above p-n junction layer and the high concentration layer, no new p-n junction layer is prepared, and likewise with the low concentration layer.

Referring to the accompanying drawings, embodiments of the present invention will now be described in detail.

An example applying the present invention to a MOSFET of a simple structure will be described with reference to FIGS. 12A and 12B.

It is possible to avoid influence to the properties such as an effective channel length or a drain breakdown voltage of a MOSFET, by burying a p-n junction layer 18 having the local Zener current reduced by the methods described above, under the source/drain region in such a manner that the p-n junction layer 18 does not overlap the gate electrode of the MOSFET from the plane viewpoint.

Figure 12A:
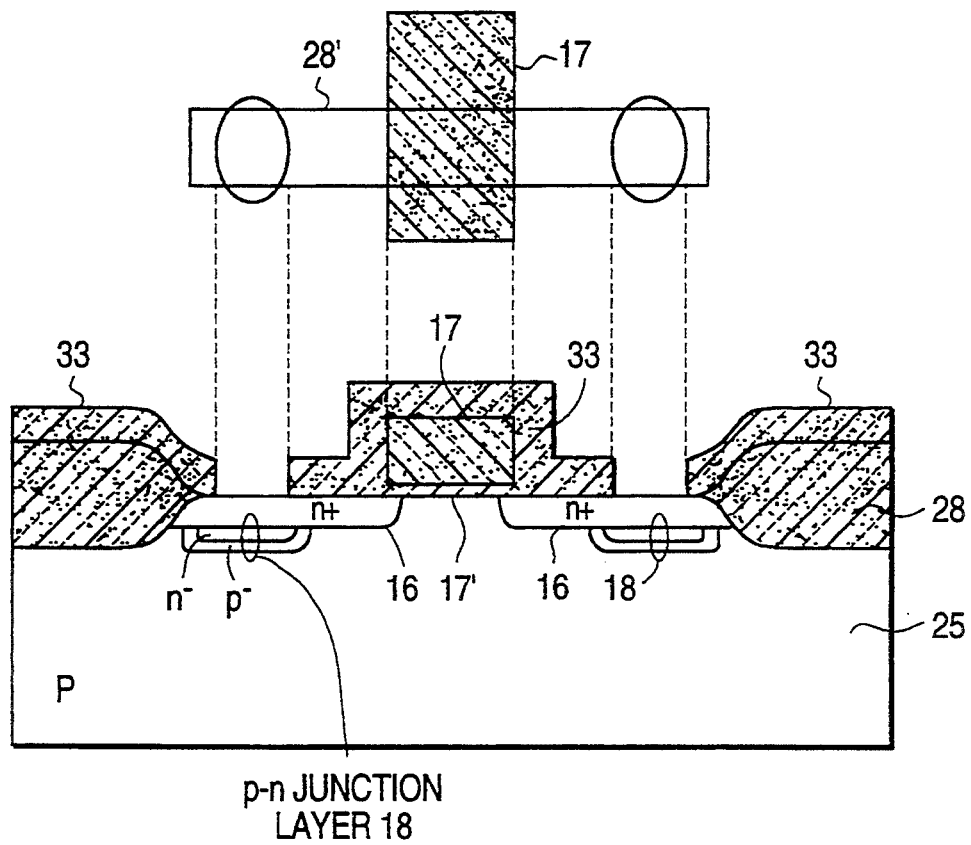
FIG. 12A is a plane view and a sectional view of a MOSFET according to an example of the present invention.

For example, as shown in FIG. 12A, the p-n junction layer 18 having the local Zener current reduced by the methods as described above, is designed so that it would not overlap a gate electrode 17 of an n-channel MOSFET formed on a p-type silicon substrate 25. That is, the upper n-type layer of this p-n junction layer 18 contacts with an n-type source/drain region 16, and the lower p-type layer of the p-n junction layer 18 contacts with a p-type silicon substrate 25.

In this MOSFET, on the p-type silicon substrate 25 having a concentration of $1 \times 10^{17}$/cm$^3$ from the surface to the depth of about 10 μm, a local oxidation film 17 having a thickness of 600 nm was formed to form an active region 28', and subsequently a gate oxidation film 17' having a thickness of 20 nm and a gate electrode 17 having a thickness of 300 nm were formed, and then an n-type region 16 of a high concentration ($10^{20}$/cm$^3$) was formed and a passivation film 33 was deposited to a thickness of 250 nm. Then, after the dry etching process of the passivation film, electrodes and wires were formed.

The gate electrode 17 is a polycrystalline silicon film having phosphorus introduced at a high concentration, and the processing thereof was conducted by dry etching with use of a photo resist film as a mask. In this case, most damages in the gate electrode processing are absorbed in the oxidation film under the polycrystalline silicon film (formed at the same time as the gate oxidation film), and therefore hardly reach the substrate side.

Further, in this processing, since over-etching of the substrate surface is hardly required, there is less possibility that the substrate surface is exposed under the dry etching conditions. Further, even if damages are introduced by the dry etching, the damaged region is hardly depleted by the formation of the high concentration n-type region 16, and the effect of the dry etching damages at this time can be substantially ignored.

On the other hand, in making the contact hole of a passivation film 33 to contact electrodes and wires to the source/drain layer 16, since the silicon substrate is directly exposed under the dry etching conditions and since over-etching of the passivation film processing should be sufficiently conducted to secure adequate electrical contact, the introduction of damages into the substrate by the dry etching will become too large to be ignored. The damage at this time results in the source of the leakage current generation by the above local Zener effect.

Actually, if wet etching is employed in place of the dry etching for making the contact hole, the leakage current increase in the MOSFET can be prevented. Particularly, the generation of the leakage current by the above local Zener effect is not necessarily caused when the dry etching is conducted, but the tendency of the generation is different by the degree of the damage of the dry etching. For example, if the over-etching on the substrate surface is increased, the tendency of the above leakage current generation becomes high. By such circumstances, in this example, just after the contact processing, a p-n junction layer 18 which satisfies the above conditions was formed under the high concentration n-type region 16.

This p-n junction layer 18 was formed by ion implantation and activation annealing so that it would be constituted of an n-type layer having An of $4 \times 10^{22}$/cm$^4$ from just under the high concentration n-type region 16 to the depth of 0.1 μm, and, just under it, a p-type layer having Ap of $1 \times 10^{22}$/cm$^4$ to the depth of 0.2 μm.

FIG. 12B shows relative impurity concentrations for the high impurity regions 16, the substrate 25 and the p and n layers of the p-n junction layer 18 of FIG. 12A, including the depths Xn and Xp of the depletion layers formed in the p-n junction layer 18 by reverse biasing. Of course, these depths Xn and Xp depend on the degree of reverse biasing. Generally, a reverse bias voltage is selected corresponding to the intended use of the device. Then, using the relationships shown in FIG. 16, impurity profiles are determined for the p-layer and the n-layer of the p-n junction layer 18 so that the depletion regions will extend completely through the p-layer and the n-layer of the p-n junction layer 18, as shown in FIG. 12B, and the profile will have the necessary slopes to satisfy the relationship $4.3 \times 10^{12}$/cm$^2$ > An·Xn$^2$ = Ap·Xp$^2$.

As a result of the use of the present invention in the arrangement of FIG. 12A, the leakage current of a MOSFET can be made at substantially the same level as the passivation film processing using the above-discussed wet etching process.

Figure 13:
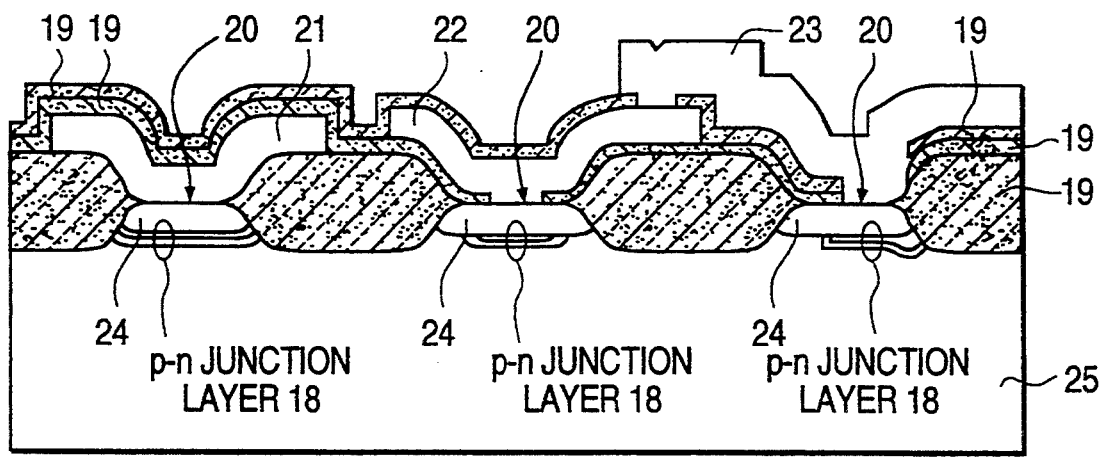
FIG. 13 is a sectional view of a semiconductor device according to an example of the present invention.

Although the invention is very useful for MOSFETs, it can also be used in other semiconductor devices, as shown in FIG. 13. For example, as shown on the left side of FIG. 13, the p-n junction layer 18 can be buried under a high concentration layer 24 so that the p-n junction layer 18 contacts with the layer 24 at the high concentration side. The conductivity type of the upper layer of the p-n junction layer 18 will be the same as the conductivity type of the high concentration layer 24, while the opposite conductivity type of the lower layer of the p-n junction layer 18 will be the same as that of the substrate 25.

The p-n junction layer 18 would cover (or, more accurately, underlie), from the plane viewpoint, the contact part of the high concentration layer 24 and a diffusion source 21 which is selected from a silicon film or a refractory metal silicide film containing carriers of the same conductivity type as the high concentration layer 24 side under the condition of high concentration as mentioned above. The carrier concentration at the interface between the high concentration layer 24 and the diffusion source 21 can then be made high, and, thus, the contact resistance at this part can be made very small. In this case, since a contact hole 20 of an insulation film 19 is often made small to adapt to miniaturization, it is very effective to make the contact resistance small. Further, it is possible to design the p-n junction layer independently of the design of the contact resistance, whereby the controllability of the process is satisfactory. Further, as shown in the middle and righthand side of FIG. 13, a similar effect can be obtained in the case of using an electrode 22 and a wire 23, made of a metal as a main component, in place of the above diffusion source 21, and, thus, very good ohmic properties can be observed at the contact with a layer 24 at the high concentration layer side. As mentioned above, the present invention provides a semiconductor device having small p-n junction without changing the design method of a conventional semiconductor device, by basically providing a p-n junction layer 18 which satisfies the above conditions under the high concentration layer. Since the p-n junction layer exists only under the conventional high concentration layer, there is no hindrance to proceed with miniaturization.

Figure 14:
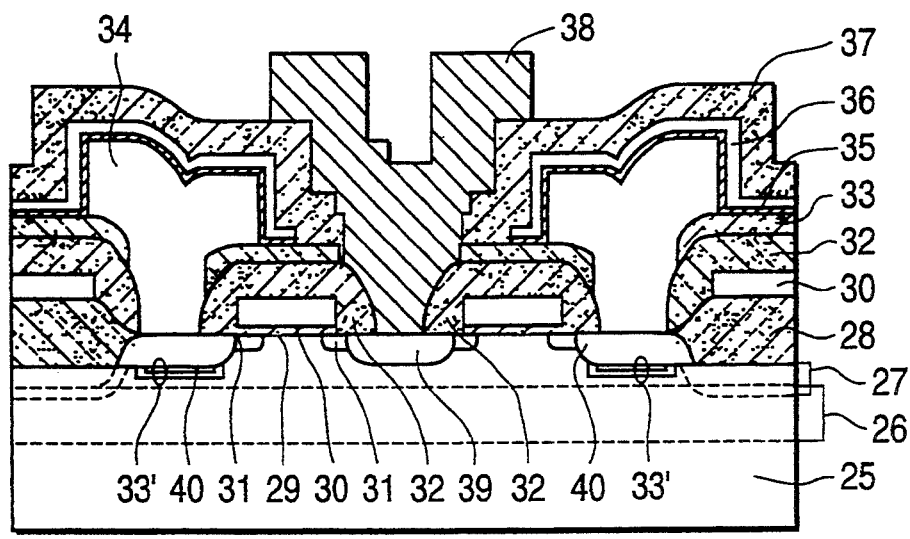
FIG. 14 is a sectional view of a dynamic random access memory as an example of the present invention.

As an example of a very large scale integration semiconductor device, first, with reference to FIG. 14, there will be described an example using a MOSFET of the present invention having a p-n junction layer buried in a switching transistor of a dynamic random access memory cell. This DRAM element is formed as follows.

First, in a p-type silicon (Si) substrate 25 having a concentration of $3 \times 10^{16}/cm^3$ from the substrate surface to the depth of 5 $\mu$m, a p-type buried layer 26 was formed so that it has a maximum carrier concentration of $3 \times 10^{17}/cm^3$ at the depth of 0.6 $\mu$m, and the width of distribution of 0.1 $\mu$m in terms of standard deviation. Device isolation was then achieved by a p-type channel stopper layer 27 having a surface concentration of $2 \times 10^{17}/cm^3$ and a local oxidation film 28 having a thickness of 500 nm.

Then, a gate region for the MOSFET was formed by a silicon dioxide film 29 for a gate insulator, having a thickness of 10 nm, and an n-type polycrystalline Si film 30 for a gate, having a thickness of 200 nm. An n-type layer 31 having a surface concentration of $1 \times 10^{19}/cm^3$ and a depth of 100 nm, was formed for a source/drain layer, and a side-wall 32 having a thickness of 200 nm was formed by use of a silicon dioxide film. After this, a silicon dioxide film 33 for passivation was deposited to the thickness of 200 nm. Next, a contact hole was made at the storage-node side by processing the silicon dioxide film 33 for passivation, and buride p-n junction layer 33' having a maximum concentration of $2 \times 10^{17}/cm^3$ at the depth of 230 nm from the surface, and the width of distribution of 80 nm in terms of standard deviation, was formed with an n-layer on top of a p-layer. This was followed by depositing and processing a polycrystalline Si layer 34 having introduced $5 \times 10^{20}/cm^3$ of phosphorus, to form a storage-node electrode. The thickness of the polycrystalline silicon was 500 nm. Next, a composite layer 35 made of silicon oxide and silicon nitride, of 5 nm calculated in terms of a silicon dioxide film thickness was formed as a capacitor insulator. Further, a 100 nm thick tungsten silicide film 36 was formed as a plate electrode. Then, a 200 nm thick silicon dioxide film 37 for passivation was deposited, a contact hole was made at the bit-line side, and a 300 nm thick tungsten silicide film 38, introduced with phosphorus P at the concentration of $5 \times 10^{20}/cm^3$, was formed/processed as a bit-line electrode.

The total thermal budget from the formation of the polycrystalline Si as the storage-node electrode to the preparation of this element, was 20 minutes in terms of 900° C. P (phosphorus) was diffused from the polycrystalline Si film 34 of the storage node to the substrate side, and thereby a high concentration n-type layer 40 having a depth of 0.15 $\mu$m was formed.

At this time, if a built-in potential $\phi$ is supposed as 0.9 V and the maximum reverse bias V at the time of DRAM operation is supposed as 5 V, in the p-n junction layer 33' of the depletion region between the high concentration n-type layer 40 and the low concentration p-type buried layer 26, the n- and p-type layers are both depleted by Xn=Xp=0.15 $\mu$m, and in this region, the slope of the carrier concentration becomes about $1.8 \times 10^{22}/cm^4$ (An, Ap). In such a p-n junction layer 33', $(Xn+Xp)/(\phi+V)$ is $5.6 \times 10^{-6}$cm/V and An·Xn$^2$ is $4.05 \times 10^{12}/cm^2$. Incidentally, such a p-n junction satisfying the above conditions may also be provided under the high concentration region 39 formed under a tungsten silicide film 38 that is used as a bit-line electrode.

A further feature of the present invention is that, in a semiconductor device containing a dynamic random access memory cell, having a structure wherein the p-n junction layer is buried under the high concentration layer under at least one condition of the above conditions, since the local Zener probability is reduced as mentioned above, when it is operated under the circumstance of at least 70° C., a retention time of a cell of a bit of medium retention time functions to be at most 5 times the retention time of the cell of the shortest retention time. This is because the frequency of the p-n junction degradation by the local Zener effect can be reduced, and the structure is dominated by the scattering of the leakage current depending on the generation-recombination center and the surface state, which are other elements of the p-n junction degradation. Further, a retention time of a cell of a bit of medium retention time functions to have a dependency on a voltage of a power source or a dependency on an operation temperature, which are equal to a dependency on a voltage of the power source or a dependency on the operation temperature of the retention time of the cell of the shortest retention time. The inventors have determined that these characteristics can be obtained in the so-called "50% fail bit" mode (wherein 50% of the memory cells are in a failure mode due to leakage current) as well as in other operating conditions.

The reasons for the above beneficial results are as follows. First, the leakage current caused by the local Zener effect shows a substantial dependency on the voltage of the power supply and less dependency on the temperature, as is understood from the formula of the Zener probability. If this local Zener current can be reduced, their dependency will be determined only by the g-r current and the surface recombination current. That is, the leakage current components of the above two cells show scattering, but are dominated by the g-r current and the surface recombination current, and they have the same dependency on the voltage of the power supply and the dependency on the temperature.

Figure 15:
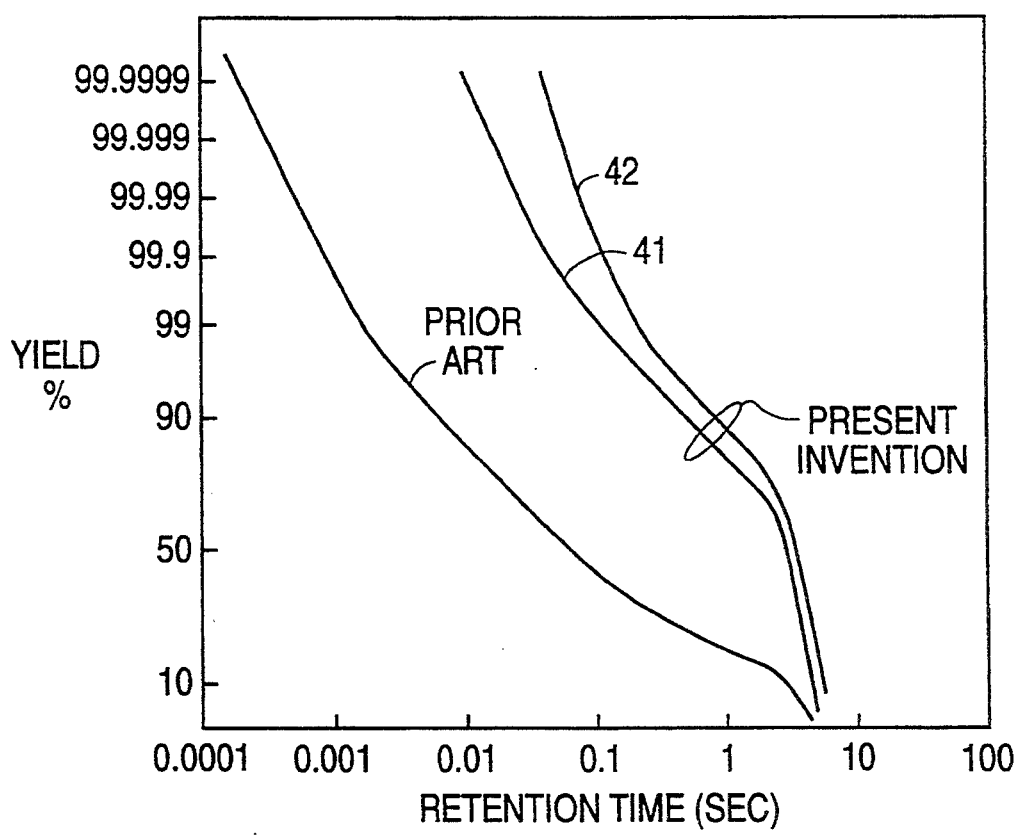
FIG. 15 is a graph showing the relationship between the yield and retention time of a dynamic random access memory according to an example of the present invention.

In the elements according to the present invention, the p-n junction leakage current is reduced, and the relation between the yield and the retention time as shown in FIG. 15 can be obtained, and, thus, the yield can be remarkably improved as compared with conventional devices. For example, when the retention time of a threshold is supposed to be 0.1 second, the yield of conventional devices was about 50%, while the yield of Example 41 shown in FIG. 15 of the present invention was improved to about 99%. Further, by applying the present invention, the retention time of the threshold can be extended to about 1 second while maintaining the 50% yield. In the element of the present invention, since the distance from the gate electrode to the contact hole at the storage-node side was 0.2 to 0.25 $\mu$m, no fluctuation of the MOSFET properties was observed. Therefore, according to the present invention, the yield and the retention time can both be remarkably improved.

Further, by changing the formation conditions of the p-n junction layer, the slope An of the n-type layer side is changed to $\frac{1}{2}$ of the above value, and thus the slope Ap of the carrier concentration at the p-type layer side is doubled, whereby the location of maximum electric field strength can be made deep. Therefore, as shown in Example 42 of FIG. 15, the yield and the retention time were slightly improved as compared with Example 41 of FIG. 15.

Figure 16:
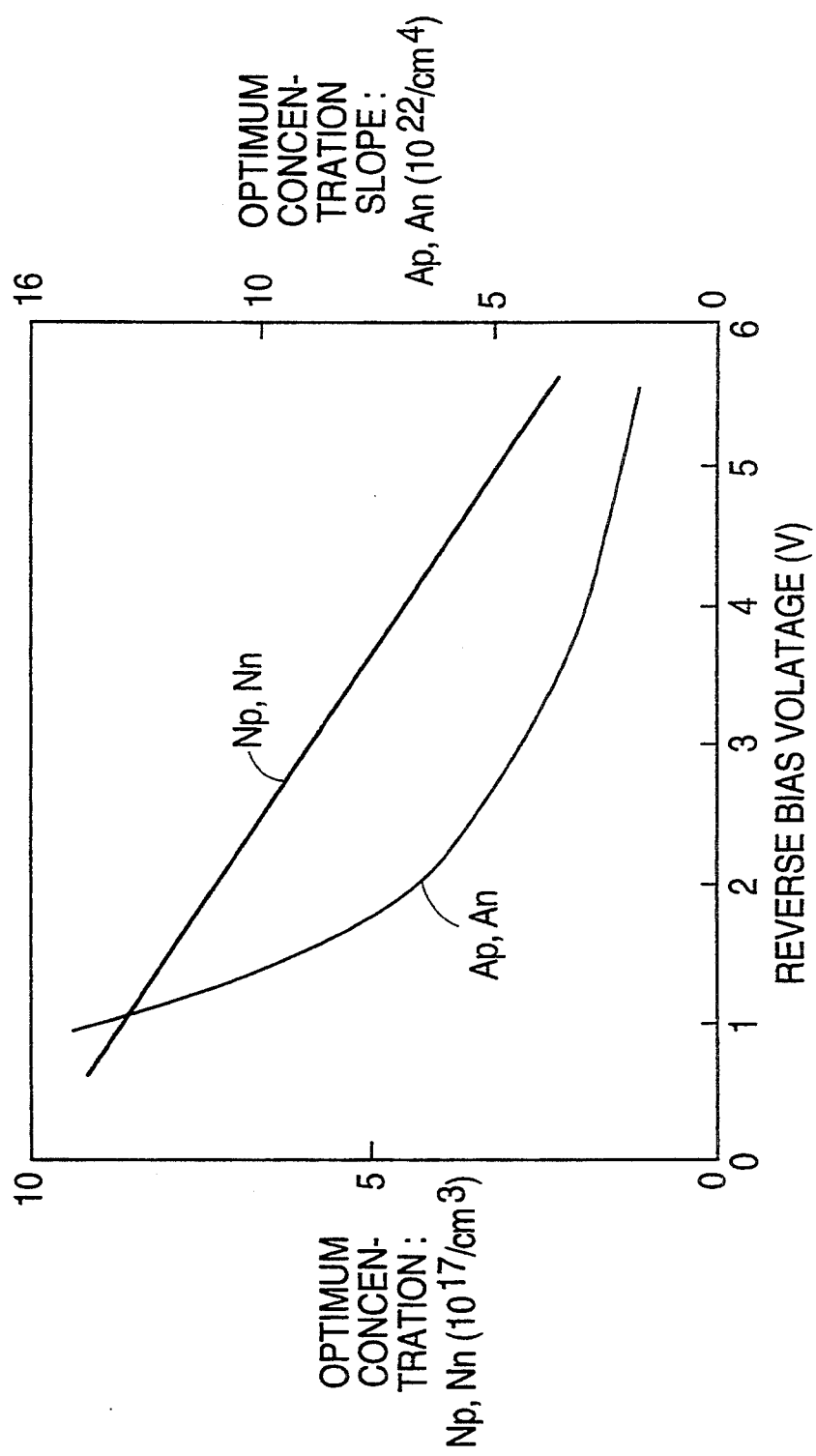
FIG. 16 is a graph showing the relationship between the reverse bias and the conditions of the carrier concentration of the p-n junction, to obtain the effect of the present invention.
Figure 17:
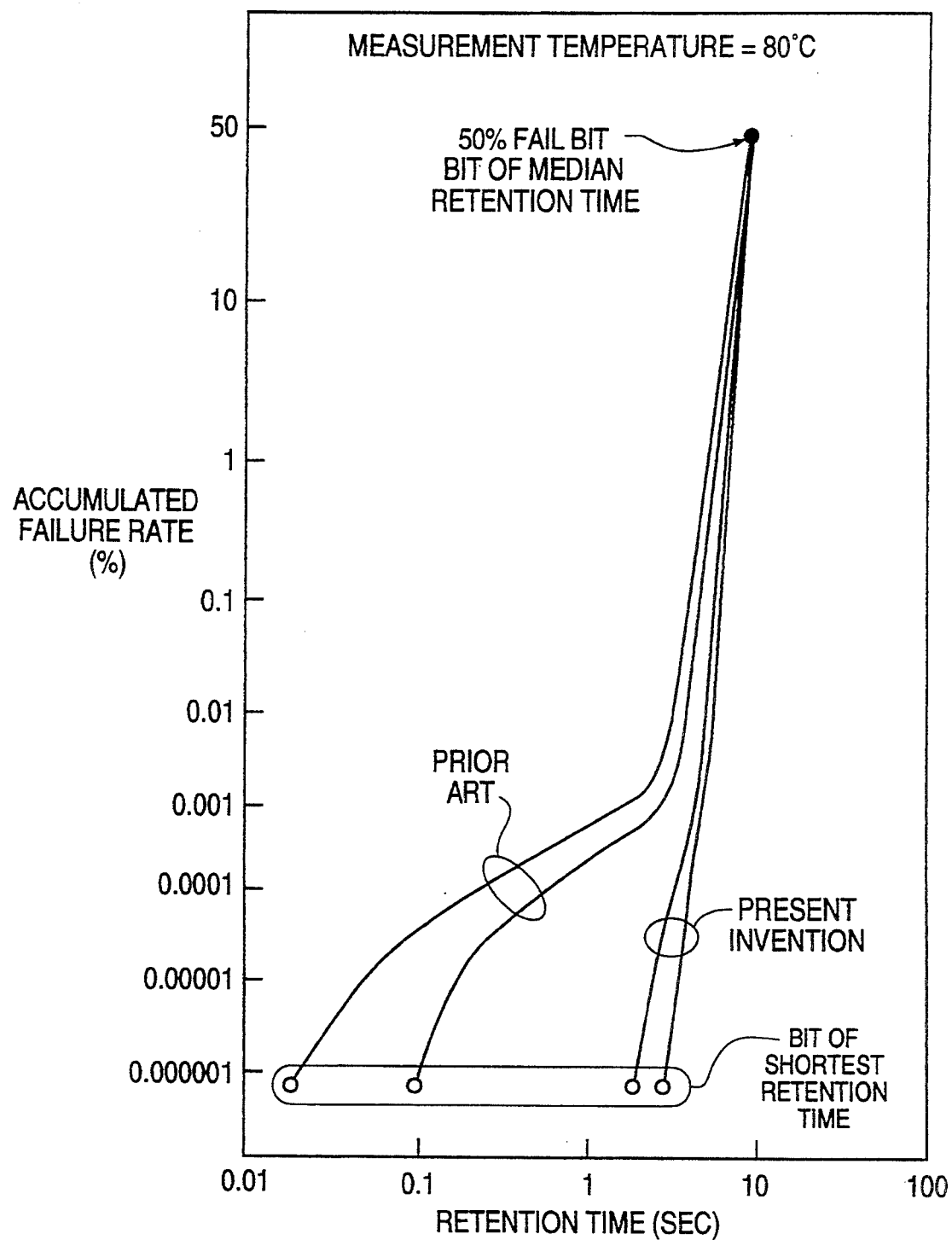
FIG. 17 is a graph showing the accumulated failure rate of a dynamic random access memory according to an example of the present invention.
Figure 18:
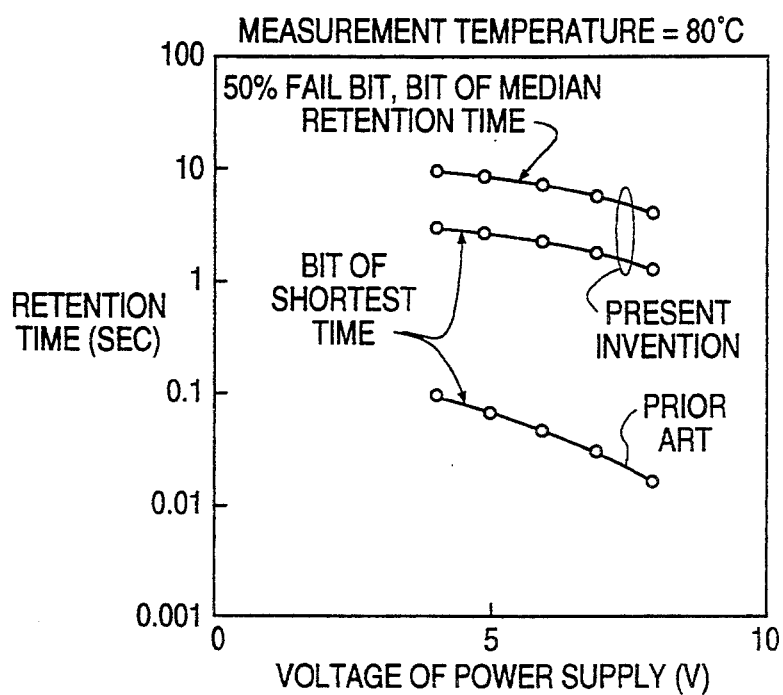
FIG. 18 is a graph showing the voltage-of-power-supply dependency of the retention time of respective cells of a dynamic random access memory according to an example of the present invention.
Figure 19:
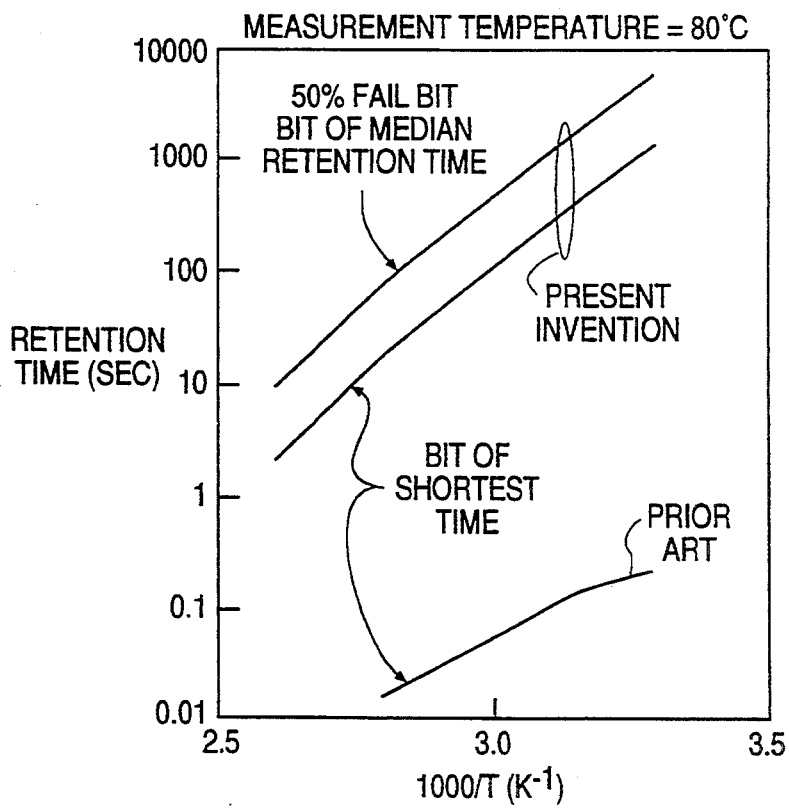
FIG. 19 is a graph showing the operation-temperature dependency of the retention time of respective cells of a dynamic random access memory according to an example of the present invention.

The p-n junction layer satisfying the above conditions can be advantageously applied to various elements having different operation voltage, since the conditions can be selected as shown in FIG. 16 depending on the change of the reverse bias biased to the p-n junction. Further, if the above quantity An.Xn$^2$ is further decreased below $4.3 \times 10^{12}/cm^2$, as shown in FIGS. 17, 18 and 19, when this element is operated at 70° C. or higher, a retention time of a cell of a bit of medium retention time of a 50% fail bit from a cell of a shortest retention time, functions to be less than about 5 times the retention time of the cell of the shortest retention time, and at both bits, the slopes of the dependency on the voltage of the power supply and the dependency on the operation temperature, of the retention time are similar to each other. As mentioned above, according to the present invention, it is possible to provide elements of various properties.

Figure 20:
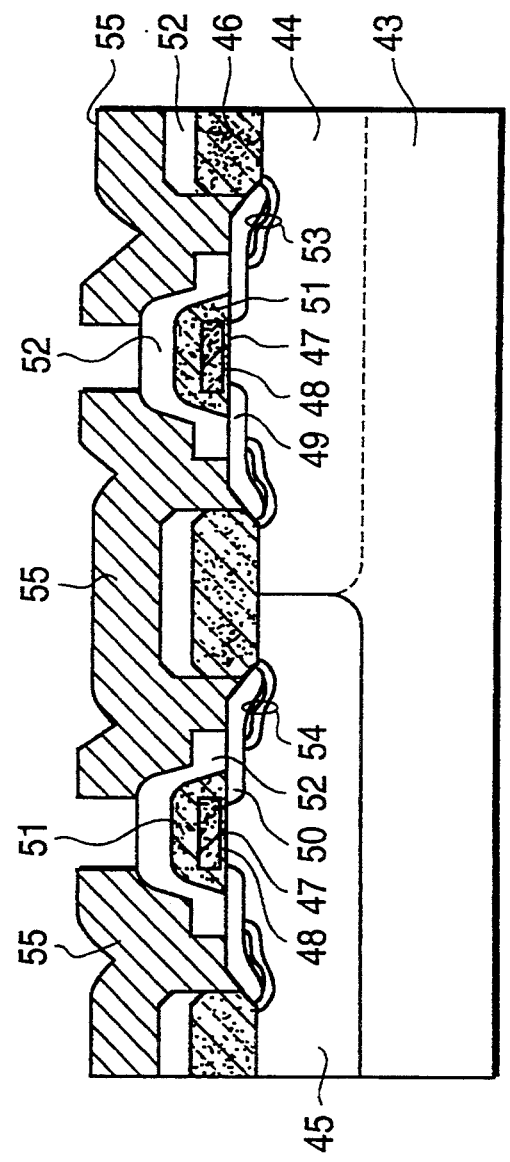
FIG. 20 is a sectional view of an element of a complementary MOS structure as an example of the present invention.

Next, an example will be described wherein the present invention is applied to an element of a complementary MOS structure as shown in FIG. 20. This element is formed as follows. Using a p-type silicon (Si) substrate 43 having a substrate concentration of $1 \times 10^{15}/cm^3$, a p-type well layer 44 having a surface concentration of $5 \times 10^{16}/cm^3$ and a depth of 5 $\mu$m, and an n-type well layer 45 having a surface concentration of $3 \times 10^{17}/cm^3$ and a depth of 8 $\mu$m, were formed. Then, in the respective well layers, buried p-n junction layers 53 and 54 are formed having a maximum carrier concentration of $1 \times 10^{18}/cm^3$ at the depth of 0.4 $\mu$m, and the width of distribution of 0.06 $\mu$m in terms of standard deviation. Then, device isolation was conducted by use of the local oxidation film 46 having a thickness of 400 nm, and a gate region for MOSFETs was formed by a silicon dioxide film 47 for a gate insulation film having a thickness of 5 nm and an n-type polycrystalline Si film 48 for a gate having a thickness of 100 nm. In the respective well regions, an n-type layer 49 and a p-type layer 50, having a surface concentration of $1 \times 10^{20}/cm^3$ and a depth of 80 nm, were formed for the source/drain regions. Then, a side wall 51 was formed by a silicon dioxide film having a film thickness of 300 nm, and a silicon dioxide film 52 for passivation was deposited to 200 nm. Next, the silicon dioxide film 52 for passivation was processed to make a contact hole. Under the n-type layer 49, the buried layer 53 has an n-type layer adjacent to the n-type layer 49, and a p-type layer adjacent the p-type well region 44. Under the p-type layer 50, the buried p-n layer 54 has a p-type layer adjacent the p-type layer 50 and an n-type layer adjacent the n-type well region 45. Each of the buried p-n layers 53 and 54 has a maximum concentration of $3 \times 10^{17}/cm^3$ at the depth of 120 nm from the substrate surface, and the width of distribution of 50 nm in terms of standard deviation. A multi-layer 55 constituted of a titanium nitride film having a film thickness of 10 nm and a tungsten film having a film thickness of 200 nm, was deposited/processed, to form an electrode and a wire.

At this time, the built-in potential $\phi$ is 0.8 V and the reverse bias V is 3 V. In the p-n junction layer between the high concentration n-type layer and the low concentration p-type layer, the n and p layers are depleted in the range of Xn=Xp=0.1 $\mu$m, and in this region, the slope of the carrier concentration is $3.5 \times 10^{22}/cm^4$ (An, Ap). In this case also, the p-n junction layer has (Xn+Xp)/($\phi$+V) of about $6 \times 10^{-6}$ cm/V and An·Xn$^2$ of $3.5 \times 10^{12}/cm^2$.

According to the present invention, to prevent the increase of the junction leakage current at respective p-n junctions, total current of the element at the time of standby can be made small and the temperature rise of the element can be made small. Since the increase of the junction leakage current can be prevented by such an inhibitive effect on the temperature rise, the element can operate with increased reliability. Further, by changing the formation conditions of the p-n junction layer, the concentration slope of a layer of the same conductivity type as the high concentration layer side is made triple the above value, and the concentration slope of a layer of the same conductivity type as the low concentration layer side is made $\frac{1}{3}$ the above value, whereby the depleted region of the layer of the same conductivity type as the high concentration layer can be reduced.

Also, according to the present invention, the failure caused by the increase of the junction leakage current of a source or drain region can be remarkably reduced while maintaining the properties of the MOSFET type semiconductor device using the MOSFET adapted to miniaturization. Thus, the reliability can be substantially improved. Further, by such an effect, the yield of the semiconductor device production can be improved, and the scattering of the element properties is remarkably reduced. It should also be noted that the effect of the present invention can be obtained when used for semiconductor devices of various voltages of power supply.

It is to be understood that the above-described arrangements are simply illustrative of the application of the principles of this invention. Numerous other arrangements may be readily devised by those skilled in the art which will embody the principles of the invention and fall within its spirit and scope.

We claim:

1. A semiconductor device comprising a MOSFET having a semiconductor body, a gate electrode, and a source region and a drain region which are formed on the semiconductor body, wherein a p-n junction having a p-type layer and an n-type layer is formed under at least one region of the source region and the drain region in such a manner that the p-n junction does not overlap the gate electrode when viewed from a plane viewpoint, wherein a carrier concentration profile of the p-type layer and a carrier concentration profile of the n-type layer are provided in such a manner that the following relation is satisfied:

$$4.3 \times 10^{12}/cm^2 > An \cdot Xn^2 = Ap \cdot Xp^2$$

where each of Xp (cm) and Xn (cm) are, respectively, depths of depletion regions formed in the p-type layer and the n-type layer by reverse biasing, and where each of Ap ($/cm^4$) and An ($/cm^4$) is a slope of the carrier concentration of the p-type layer and the n-type layer, respectively, wherein one of said p-type layer and said n-type layer is formed on said semiconductor body and the other of said p-type layer and said n-type layer is formed between said one of said p-type layer and said n-type layer and said at least one region of the source and drain region, and wherein said one of said p-type layer and said n-type layer formed on said semiconductor body has a lower carrier concentration than the carrier concentration of said semiconductor body.

2. A semiconductor device according to claim 1, wherein the carrier concentration of said one of said p-type layer and said n-type layer formed on said semiconductor body decreases with distance away from the semiconductor body.

3. A semiconductor device according to claim 2, wherein the carrier concentration of the other of said p-type layer and the n-type layer has a carrier concentration that is lower than the carrier concentration of said at least one region of the source region and the drain region.

4. A semiconductor device according to claim 3, wherein the carrier concentration of the other of said p-type layer and the n-type layer increases with distance away from said one of said p-type layer and said n-type layer.

5. A semiconductor device according to claim 1, wherein the p-n junction is formed under a contact hole of at least one of the source region and the drain region.

6. A semiconductor device according to claim 1, wherein the MOSFET having the p-n junction formed thereunder, is a switching transistor of a dynamic random access memory cell, wherein a plurality of said dynamic random access memory cells are provided.

7. A semiconductor device according to claim 6, wherein, when operated under an environmental condition of at least 70° C., a retention time of one of said memory cells of medium retention time is not more than 5 times the retention time of a memory cell of the shortest retention time.

8. A semiconductor device according to claim 7, wherein a retention time of said one of said memory cells of medium retention time has a dependency on a voltage of a power supply or a dependency on an operation temperature, which are equal to a dependency on the voltage of the power supply or a dependency on an operation temperature of the retention time of the memory cell of the shortest retention time.

9. A semiconductor device according to claim 1, wherein the reverse biasing and the carrier concentration profiles of the n-layer and the p-layer are set so that the depths Xn and Xp of the depletion regions are respectively equal to the thicknesses of the n-type layer and the p-type layer of the p-n junction.

10. A semiconductor device according to claim 8, wherein the p-n junction is formed under a contact hole of the source region or the drain region.

11. A semiconductor device according to claim 8, wherein the MOSFET having the p-n junction formed thereunder, is a switching transistor of dynamic random access memory cell, wherein a plurality of said dynamic random access memory cells are provided.

12. A semiconductor device according to claim 11, wherein when operated under an environmental condition of at least 70° C., a retention time of one of said memory cells of medium retention time is not more than 5 times the retention time of a memory cell of the shortest retention time.

13. A semiconductor device according to claim 12, wherein a retention time of said one of said memory cells of medium retention time has a dependency on a voltage of a power supply or a dependency on an operation temperature, which are equal to a dependency on the voltage of the power supply or a dependency on an operation temperature of the retention time of the memory cell of the shortest retention time.

14. A semiconductor device comprising a MOSFET having a semiconductor body, a gate electrode, and a source region and a drain region which are formed on the semiconductor body, wherein a p-n junction comprising a p-type layer and an n-type layer is formed under at least one region of the source region and the drain region in such a manner that the p-n junction does not overlap the gate electrode when viewed from a plane viewpoint;

wherein a carrier concentration profile of the p-type layer and a carrier concentration profile of the n-type layer are provided in such a manner that when a reverse bias voltage is biased to the p-n junction, an electric field increased by a local electric field enhancement created by a precipitate different from a semiconductor substance in a depletion layer in the p-n junction, is not more than 1 NV/cm, wherein one of said p-type layer and said n-type layer is formed on said semiconductor body and the other of said p-type layer and said n-type layer is formed between said one of said p-type layer and said n-type layer and said at least one region of the source and drain region, and wherein said one of said p-type layer and said n-type layer formed on said semiconductor body has a lower carrier concentration than the carrier concentration of said semiconductor body.

15. A semiconductor device according to claim 14, wherein the carrier concentration of said one of said p-type layer and said n-type layer formed on said semiconductor body decreases with distance away from the semiconductor body.

16. A semiconductor device according to claim 15, wherein the carrier concentration of the other of the other of said p-type layer and the n-type layer has a carrier concentration that is lower than the carrier concentration of said at least one region of the source region and the drain region.

17. A semiconductor device according to claim 16, wherein the carrier concentration of the other of said p-type layer and the n-type layer increases with distance away from said one of said p-type layer and said n-type layer.

18. A semiconductor device comprising:
a semiconductor body having a first conductivity type;
a first semiconductor region formed on said semiconductor body, wherein said first semiconductor region has a second conductivity type opposite to said first conductivity type; and
a p-n junction layer formed under said first semiconductor region, wherein said p-n junction layer includes a p-type layer and an n-type layer, and wherein a carrier concentration profile of the p-type layer and a carrier concentration profile of the n-type layer are provided in such a manner that the following relation is satisfied:

$$4.3 \times 10^{12}/cm^2 > An \cdot Xn^2 = Ap \cdot Xp^2$$

where each of Xp (cm) and Xn (cm) are, respectively, depths of depletion regions formed in the p-type layer and the n-type layer to be depleted by reverse biasing, and where each of Ap (/cm$^4$) and An (/cm$^4$) is a slope of the carrier concentration of the p-type layer and the n-type layer, respectively, wherein said one of said p-type layer and said n-type layer is formed on said semiconductor body and the other of said p-type layer and said n-type layer is formed between said one of said p-type layer and said n-type layer and said first semiconductor region, and wherein said one of said p-type layer and said n-type layer formed on the semiconductor substrate has a lower carrier concentration than the carrier concentration of said semiconductor body.

19. A semiconductor device according to claim 13, wherein the reverse biasing and the carrier concentration profiles of the n-type layer and the p-type layer are set so that the depths Xn and Xp of the depletion regions are respectively equal to the thickness of the n-layer and the p-layer of the p-n junction.

20. A semiconductor device according to claim 18, wherein the carrier concentration of said one of said p-type layer and said n-type layer formed on said semiconductor body decreases with distance away from the semiconductor body.

21. A semiconductor device according to claim 20, wherein the carrier concentration of the other of said p-type layer and the n-type layer has a carrier concentration that is lower than the carrier concentration of said first semiconductor region.

22. A semiconductor device according to claim 21, wherein the carrier concentration of the other of said p-type layer and the n-type layer increases with distance away from said one of said p-type layer and said n-type layer.

23. A semiconductor device comprising:
a semiconductor body having a first conductivity type;
a first semiconductor region formed on said semiconductor body, wherein said first semiconductor region has a second conductivity type opposite to said first conductivity type; and
a p-n junction layer formed under said first semiconductor region, wherein said p-n junction layer includes a p-type layer and an n-type layer,
wherein a carrier concentration profile of the p-type layer and a carrier concentration profile of the n-type layer are provided in such a manner that when a reverse bias voltage is biased to the p-n junction, an electric field increased by a local electric field enhancement created by a precipitate different from a semiconductor substance in a depletion layer in the p-n junction, is not more than 1 MV/cm, wherein said one of said p-type layer and said n-type layer is formed on said semiconductor body and the other of said p-type layer and said n-type layer is formed between said one of said p-type layer and said n-type layer and said first semiconductor region, and wherein said one of said p-type layer and said n-type layer formed on the semiconductor substrate has a lower carrier concentration than the carrier concentration of said semiconductor body.

24. A semiconductor device according to claim 23, wherein the carrier concentration of said one of said p-type layer and said n-type layer formed on said semiconductor body decreases with distance away from the semiconductor body.

25. A semiconductor device according to claim 24, wherein the carrier concentration of the other of said p-type layer and the n-type layer has a carrier concentration that is lower than the carrier concentration of said first semiconductor region.

26. A semiconductor device according to claim 25, wherein the carrier concentration of the other of said p-type layer and the n-type layer increases with distance away from said one of said p-type layer and said n-type layer.

* * * * *